(12) United States Patent
Hammond et al.

(10) Patent No.: US 10,586,173 B2
(45) Date of Patent: Mar. 10, 2020

(54) SEARCHABLE DATABASE OF TRAINED ARTIFICIAL INTELLIGENCE OBJECTS THAT CAN BE REUSED, RECONFIGURED, AND RECOMPOSED, INTO ONE OR MORE SUBSEQUENT ARTIFICIAL INTELLIGENCE MODELS

(71) Applicant: Bonsai AI, Inc., Berkeley, CA (US)

(72) Inventors: Mark Isaac Hammond, Berkeley, CA (US); Keen McEwan Browne, Berkeley, CA (US); Marcos Campos, Carlsbad, CA (US); Matthew James Brown, San Francisco, CA (US); Ruofan Kong, Berkeley, CA (US); William Guss, Berkeley, CA (US); Ross Story, Berkeley, CA (US)

(73) Assignee: Bonsai AI, Inc., Berkeley, CA (US)

( * ) Notice: Subject to any disclaimer, the term of this patent is extended or adjusted under 35 U.S.C. 154(b) by 441 days.

(21) Appl. No.: 15/417,075

(22) Filed: Jan. 26, 2017

(65) Prior Publication Data

US 2017/0213155 A1 Jul. 27, 2017

Related U.S. Application Data

(60) Provisional application No. 62/287,861, filed on Jan. 27, 2016.

(51) Int. Cl.
*G06N 20/00* (2019.01)
*G06F 16/951* (2019.01)
(Continued)

(52) U.S. Cl.
CPC ......... *G06N 20/00* (2019.01); *G06F 3/0482* (2013.01); *G06F 8/31* (2013.01); *G06F 8/38* (2013.01);
(Continued)

(58) Field of Classification Search
CPC ......... G06N 20/00; G06N 3/008; G06N 3/04; G06N 3/0454; G06N 3/08; G06N 3/105;
(Continued)

(56) References Cited

U.S. PATENT DOCUMENTS 5,619,618 A 4/1997 Bigus
6,449,603 B1 9/2002 Hunter
(Continued)

FOREIGN PATENT DOCUMENTS

WO WO 2015/017706 2/2015

OTHER PUBLICATIONS

Cross-Reference to Related Applications Under 37 C.F.R. 1.78, 2 pages.
(Continued)

*Primary Examiner* — Austin Hicks
(74) *Attorney, Agent, or Firm* — Alleman Hall Creasman & Tuttle LLP

(57) ABSTRACT

An AI database hosted on cloud platform is configured to cooperate with a search engine and an AI engine. The AI database stores and indexes trained AI objects and its class of AI objects have searchable criteria. The AI database cooperates with the search engine to utilize search criteria supplied from a user, from either or both 1) via scripted software code and 2) via data put into defined fields of a user interface. The search engine utilizes the search criteria in order for the search engine to retrieve one or more AI data objects that have already been trained as query results. The AI database is coupled to an AI engine to allow any of reuse, reconfigure ability, and recomposition of the one or more trained AI data objects from the AI database into a new trained AI model.

23 Claims, 10 Drawing Sheets

Figure 1:
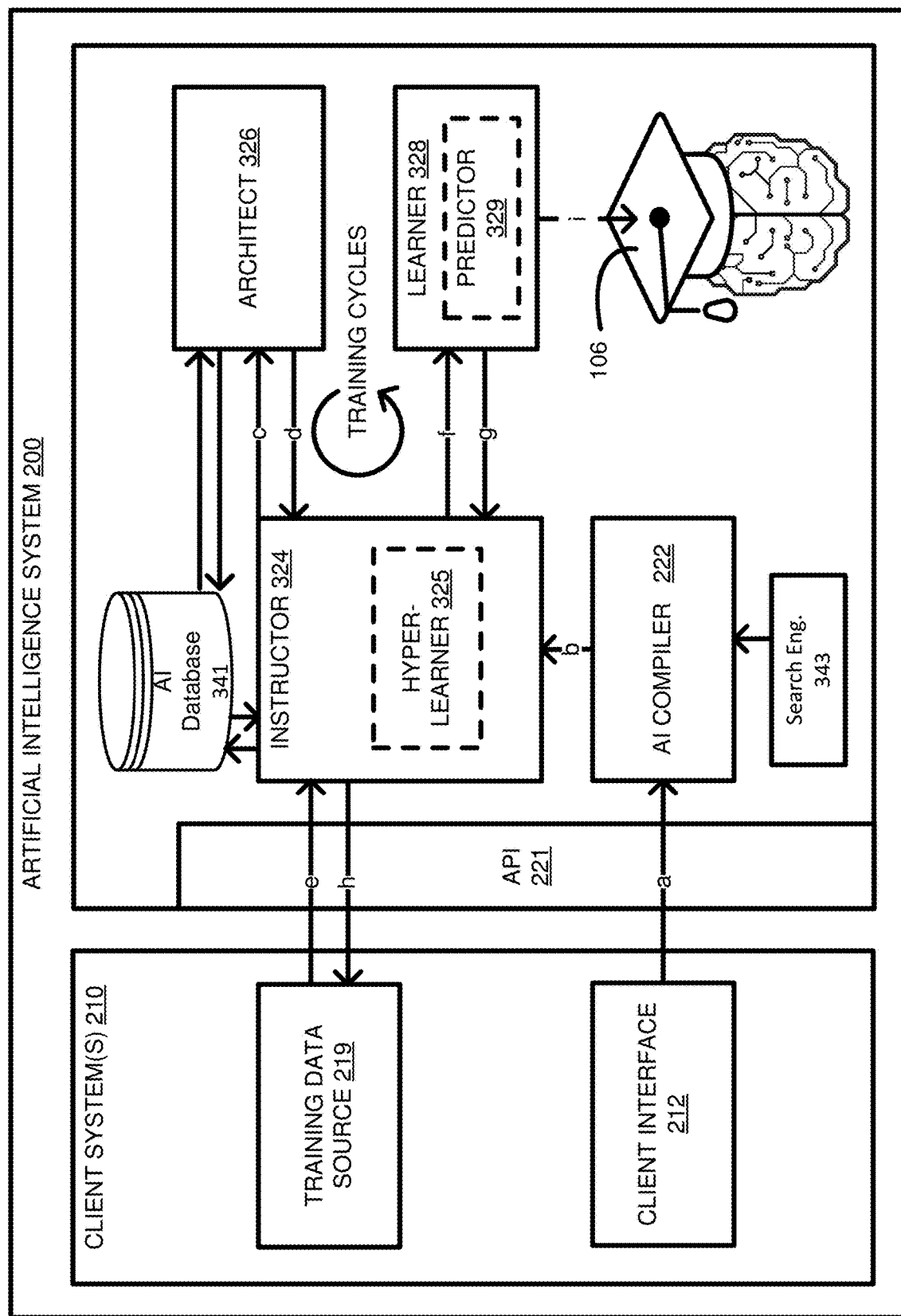

(51) Int. Cl.
*G06F 16/22* (2019.01)
*G06F 8/38* (2018.01)
*G06Q 10/00* (2012.01)
*G06F 8/30* (2018.01)
*G06N 3/08* (2006.01)
*G06N 3/04* (2006.01)
*H04L 29/06* (2006.01)
*G06F 9/451* (2018.01)
*G06F 3/0482* (2013.01)
*G06F 17/50* (2006.01)
*G06N 3/00* (2006.01)
*G06N 5/04* (2006.01)
*G06F 9/48* (2006.01)
*G06F 15/80* (2006.01)
*G06K 9/62* (2006.01)
*G06F 3/0354* (2013.01)
*G06F 17/24* (2006.01)

(52) U.S. Cl.
CPC ............ *G06F 9/451* (2018.02); *G06F 9/4881* (2013.01); *G06F 15/80* (2013.01); *G06F 16/2228* (2019.01); *G06F 16/951* (2019.01); *G06F 17/5009* (2013.01); *G06K 9/6257* (2013.01); *G06N 3/008* (2013.01); *G06N 3/04* (2013.01); *G06N 3/0454* (2013.01); *G06N 3/08* (2013.01); *G06N 5/04* (2013.01); *G06Q 10/00* (2013.01); *H04L 67/42* (2013.01); *G06F 3/03543* (2013.01); *G06F 17/24* (2013.01); *G06F 2217/14* (2013.01)

(58) Field of Classification Search
CPC ....... G06N 5/04; G06F 9/451; G06F 16/2228; G06F 16/951; G06F 3/0482; G06F 8/31; G06F 8/38; G06F 9/4881; G06F 15/80; G06F 17/5009; G06F 3/03543; G06F 17/24; G06F 2217/14; G06K 9/6257; G06Q 10/00; H04L 67/42
See application file for complete search history.

(56) References Cited

U.S. PATENT DOCUMENTS

| | | | |
|---|---|---|---|
| 8,521,664 | B1 | 8/2013 | Lin et al. |
| 9,443,192 | B1 | 9/2016 | Cosic |
| 9,460,088 | B1 | 10/2016 | Sak et al. |
| 2005/0034109 | A1 | 2/2005 | Hamilton et al. |
| 2005/0114280 | A1 | 5/2005 | Rising, III |
| 2005/0132032 | A1 | 6/2005 | Bertrand |
| 2005/0197991 | A1 | 9/2005 | Wray et al. |
| 2006/0166174 | A1 | 7/2006 | Rowe et al. |
| 2006/0218107 | A1 | 9/2006 | Young |
| 2009/0106165 | A1 | 4/2009 | Solomon |
| 2009/0106178 | A1 | 4/2009 | Chu |
| 2009/0204563 | A1 | 8/2009 | Gerber et al. |
| 2010/0088258 | A1 | 4/2010 | Oaten et al. |
| 2010/0106714 | A1 | 4/2010 | Lim et al. |
| 2012/0209794 | A1 | 8/2012 | Jones, III |
| 2012/0239598 | A1 | 9/2012 | Cascaval et al. |
| 2015/0066929 | A1 | 3/2015 | Satzke et al. |
| 2015/0339570 | A1 | 11/2015 | Scheffler |
| 2016/0034809 | A1 | 2/2016 | Trenholm et al. |
| 2016/0283202 | A1 | 9/2016 | Sellers-Blais |
| 2017/0091670 | A1* | 3/2017 | Gulin ............... G06N 20/00 |
| 2017/0213126 | A1 | 7/2017 | Hammond et al. |
| 2017/0213128 | A1 | 7/2017 | Hammond et al. |
| 2017/0213131 | A1 | 7/2017 | Hammond et al. |
| 2017/0213132 | A1 | 7/2017 | Hammond et al. |
| 2017/0213154 | A1 | 7/2017 | Hammond et al. |
| 2017/0213156 | A1 | 7/2017 | Hammond et al. |
| 2017/0308800 | A1* | 10/2017 | Cichon ............ G06N 20/00 |
| 2018/0293463 | A1 | 10/2018 | Brown |
| 2018/0293498 | A1 | 10/2018 | Campos et al. |
| 2018/0293517 | A1 | 10/2018 | Browne et al. |
| 2018/0307945 | A1 | 10/2018 | Haigh et al. |
| 2018/0357047 | A1 | 12/2018 | Brown et al. |
| 2018/0357152 | A1 | 12/2018 | Browne et al. |
| 2018/0357543 | A1 | 12/2018 | Brown et al. |
| 2018/0357552 | A1 | 12/2018 | Campos et al. |

OTHER PUBLICATIONS

Bonsai AI, Inc. Services Overview, 3 pages.
Chung, Kiuk, "Generating Recommendations at Amazon Scale with Apache Spark and Amazon DSSTNE", AWS Big Data Blog, Jul. 9, 2016, 10 pages.
Dunn, Jeffrey, "Introducing FBLearner Flow: Facebook's AI backbone", Engineering Blog, Facebook Code, Dec. 20, 2016, 11 pages.
Gray, Kathryn E., "Towards Customizable Pedagogic Programming Languages", dissertation submitted to the School of Computing at the University of Utah, Aug. 2006, 156 pages.
Hammond, Mark et al. "AI for Everyone: An Introduction to Bonsai BRAIN and Inkling" Bonsai AI, Inc. Whitepaper, 2016, 16 pages.
He, Jinru, "Auto scaling Pinterest" Pinterest Engineering Blog, Sep. 16, 2016, 7 pages.
Ma, Kevin, "Applying deep learning to Related Pins" Pinterest Engineering Blog, Jan. 12, 2017, 8 pages.
Raschka, Sebastian, "Fitting a model via closed-form equations vs. Gradient Descent vs Stochastic Gradient Descent vs Mini-Batch Learning. What is the difference?" Machine Learning FAQ, Jan. 17, 2017, 6 pgs.
SuperUser.Com, "What's the difference between an Application, Process, and Services?" Jan. 20, 2017, 1 page.
Tessler, Chen et al., "A Deep Hierarchical Approach to Lifelong Learning in Minecraft" Technion Israel Institute of Technology, Nov. 30, 2016, 10 pages.
www.docker, "Build, Ship, Run Any App, Anywhere", https://dockercon.smarteventscloud.com/portal/newreg.ww DockerCon 2017, 7 pages.
International Search Report and Written Opinion for International Application PCT/US2017/015446 dated Apr. 10, 2017, 6 pages.
International Search Report and Written Opinion for International Application PCT/US2017/015460 dated May 5, 2017, 11 pages.
International Search Report and Written Opinion for International Application PCT/US2017/015470 dated Apr. 21, 2017, 11 pages.
Campos, et al., "Concept Network Reinforcement Learning for Flexible Dexterous Manipulation", Retrieved From: https://medium.com/@BonsaiAI/concept-network-reinforcement-learning-for-flexible-dexterous-manipulation-47bf459b19b9, Sep. 19, 2017, 11 Pages.
Gudimella, et al., "Deep Reinforcement Learning for Dexterous Manipulation With Concept Networks", Retrieved From: https://arxiv.org/pdf/1709.06977.pdf, Sep. 20, 2017, 16 Pages.
Hengst, Bernhard, "Safe State Abstraction and Reusable Continuing Subtasks in Hierarchical Reinforcement Learning", In Proceedings of 20th Joint Conference on Artificial Intelligence, Dec. 2, 2007, 11 Pages.
"International Search Report & Written Opinion Issued in PCT Application No. PCT/US2018/037650", dated Aug. 31, 2018, 10 Pages.
"Non-Final Office Action Issued in U.S. Appl. No. 15/416,904", dated Aug. 14, 2019, 11 Pages.
"Extended Search Report Issued in European Patent Application No. 17745025.1", dated Aug. 23, 2019, 9 Pages.
"Extended Search Report Issued in European Patent Application No. 17745016.0", dated Aug. 20, 2019, 8 Pages.
"Extended Search Report Issued in European Patent Application No. 17745030.1", dated Sep. 2, 2019, 7 Pages.
"Non Final Office Action Issued in U.S. Appl. No. 15/416,988", dated Oct. 3, 2019, 11 Pages.
"Non Final Office Action Issued in U.S. Appl. No. 15/417,056", dated Oct. 17, 2019, 10 Pages.
"Non Final Office Action Issued in U.S. Appl. No. 15/417,086", dated Nov. 7, 2019, 13 Pages.

(56) References Cited

OTHER PUBLICATIONS

Beale, et al., "Neural Network Toolbox 7 User's Guide", Retrieved from http://citeseerx.ist.psu.edu/viewdoc/download?doi=10.1.1.220. 1640&rep=rep1&type=pdf, 2010, 951 Pages.
"Non Final Office Action issued in U.S. Appl. No. 15/416,970", dated Nov. 21, 2019, 12 Pages.
"Non Final Office Action issued in U.S. Appl. No. 15/417,033", Nov. 26, 2019, 13 Pages.

* cited by examiner

```
                              ┌─ Cont. ─┐
                              └────┬────┘
                                   ▼
```

The search engine utilizes the user supplied criteria to query for relevant trained AI objects by referring to 1) the signatures of the stored AI objects as well as 2) any indexed parameters for the AI objects indexed by the AI database.
114

A user interface presents a population of known trained AI objects; and searching the population of known trained AI objects to return a set of one or more already trained AI objects similar to a problem trying to be solved by the user supplying the search criteria.
116

The AI database is configured to be a set of one or more data bases so that each database has a different profile and indexing. The set of data bases are configured to operate in a parallel to then send back accurate, fast, and efficient returns of trained AI objects that satisfy the search query.
118

The AI database cooperate with the AI engine to supply one or more AI objects. The AI engine includes an architect module configured to create and optimize learning topologies of neural networks for the AI objects; an instructor module configured to carrying out a training plan codified in a pedagogical software programming language; and a learner module configured to carrying out an actual execution of underlying artificial intelligence learning algorithms during a training session, where the architect module, when reconfiguring or recomposing the AI objects, composes the one or more trained AI data objects into a new AI model and the instructor module and learner module cooperate with one or more data sources to train the new AI model.
120

The AI database cooperates with an AI engine to cause any of reuse, reconfigure ability, and recomposition of the one or more trained AI data objects into a new trained AI model.
122

Fig. 5B    End

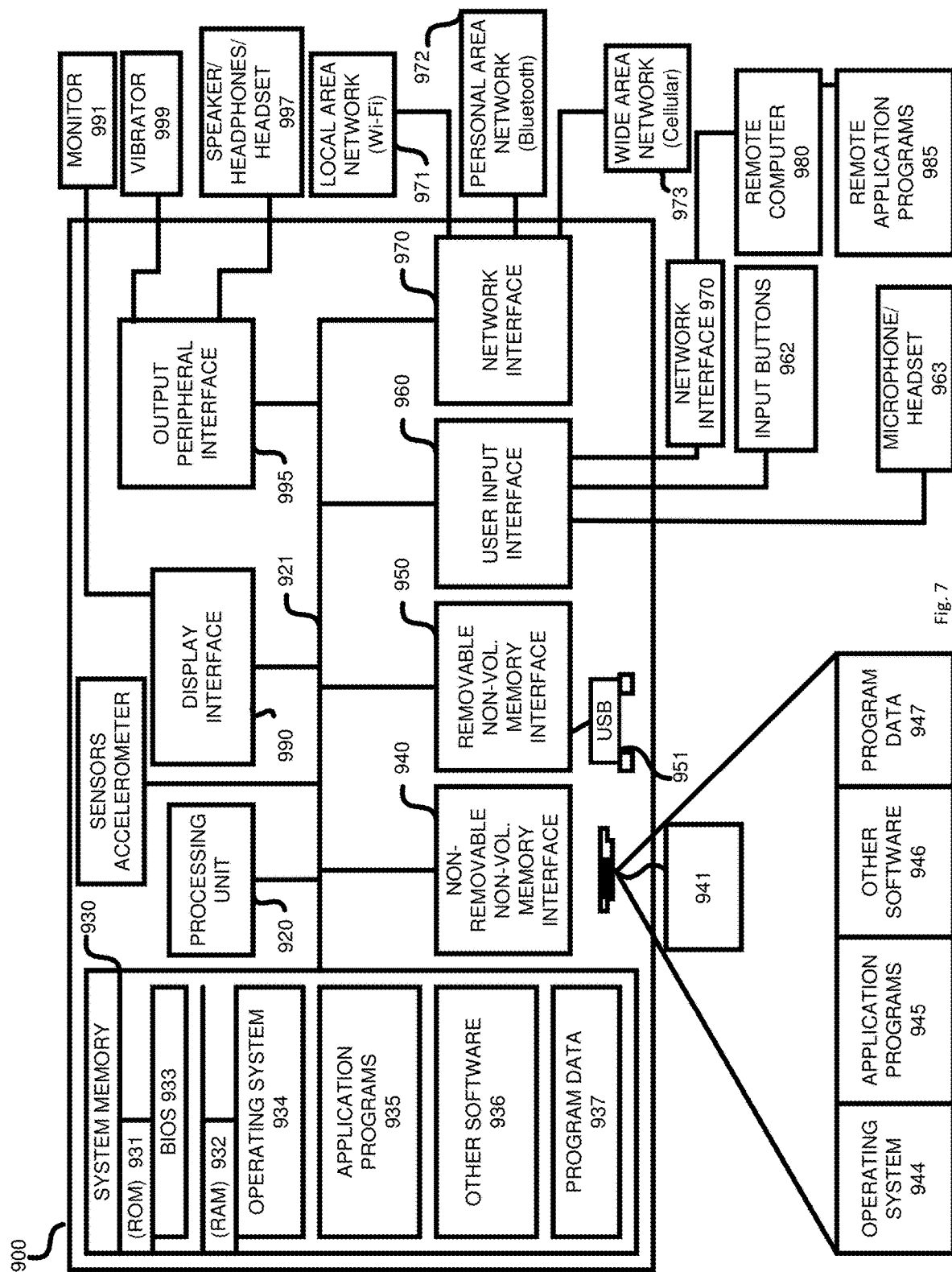

SEARCHABLE DATABASE OF TRAINED ARTIFICIAL INTELLIGENCE OBJECTS THAT CAN BE REUSED, RECONFIGURED, AND RECOMPOSED, INTO ONE OR MORE SUBSEQUENT ARTIFICIAL INTELLIGENCE MODELS

CROSS-REFERENCE

This application claims priority to U.S. Provisional Patent Application No. U.S. 62/287,861, filed Jan. 27, 2016, titled "BONSAI PLATFORM, LANGUAGE, AND TOOLING," the disclosure of which is hereby incorporated herein by reference in its entirety.

NOTICE OF COPYRIGHT

A portion of this disclosure contains material that is subject to copyright protection. The copyright owner has no objection to the facsimile reproduction by anyone of the material subject to copyright protection as it appears in the United States Patent & Trademark Office's patent file or records, but otherwise reserves all copyright rights whatsoever.

FIELD

Embodiments of the design provided herein generally relate to artificial intelligence ("AI") systems and a searchable database of AI objects.

BACKGROUND

An engineer may need to attempt hundreds of experiments before finding a successful new feature or set of hyper parameters. Traditional pipeline systems do not provide a way to rerun pipelines with different inputs, mechanisms to explicitly capture outputs and/or side effects, and visualization of outputs.

SUMMARY

Provided herein in some embodiments is an AI database hosted on cloud platform is configured to cooperate with a search engine and an AI engine. In an embodiment, the AI database stores and indexes trained AI objects and its class of AI objects have searchable criteria. The AI database cooperates with the search engine to utilize search criteria supplied from a user, from either or both 1) via scripted software code and 2) via data put into defined fields of a user interface. The search engine utilizes the search criteria in order for the search engine to retrieve one or more AI data objects that have already been trained as query results. The AI database is coupled to an AI engine to allow any of reuse, reconfigure ability, and recomposition of the one or more trained AI data objects from the AI database into a new trained AI model. These and other features of the design provided herein can be better understood with reference to the drawings, description, and claims, all of which form the disclosure of this patent application.

DRAWINGS

The drawings refer to some embodiments of the design provided herein in which:

FIG. 1 provides a schematic illustrating an AI system in accordance with some embodiments.

Figure 2A:
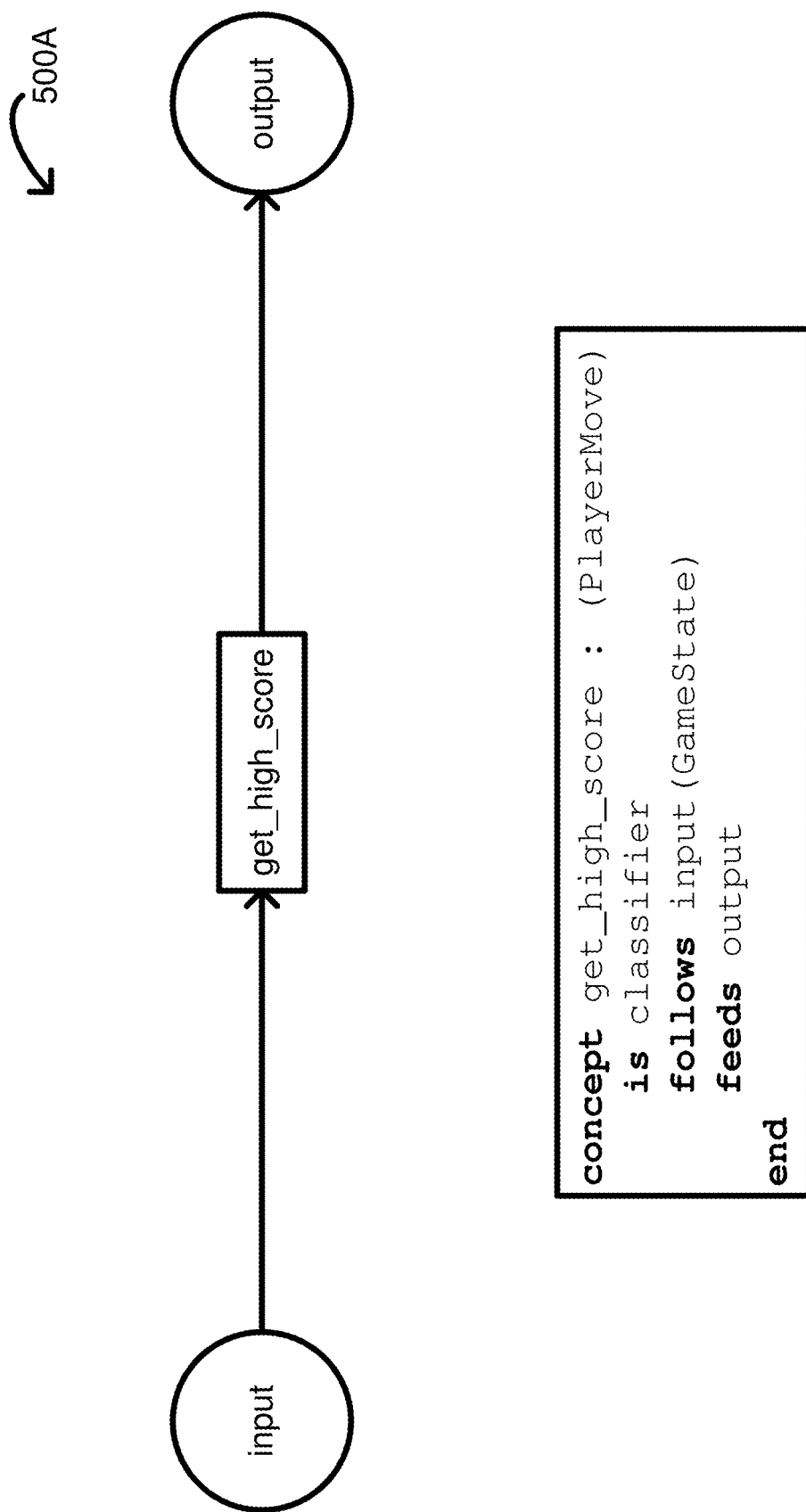

FIG. 2A provides a schematic illustrating a mental model in accordance with some embodiments.

Figure 2B:
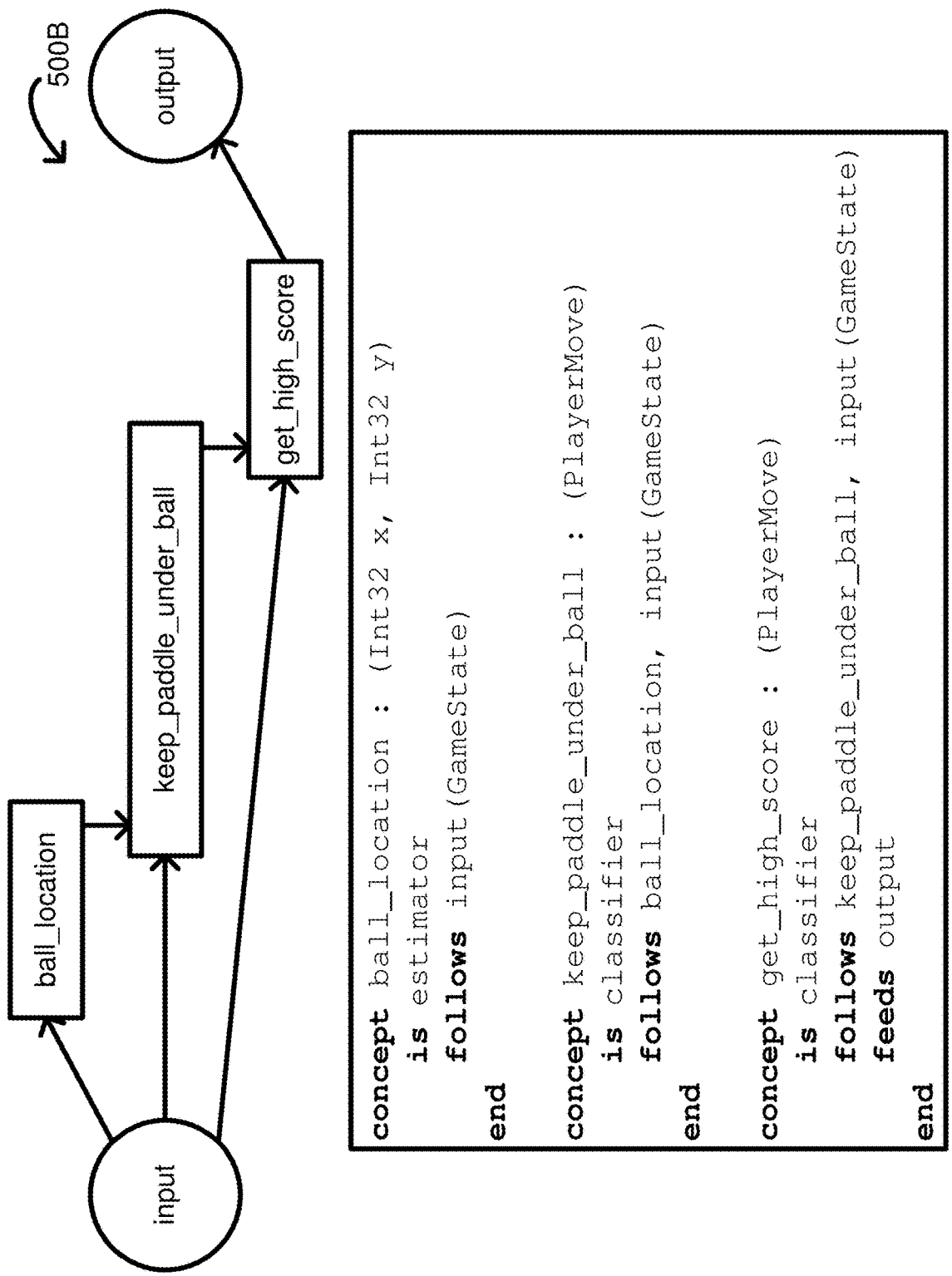

FIG. 2B provides a schematic illustrating a mental model in accordance with some embodiments.

Figure 3:
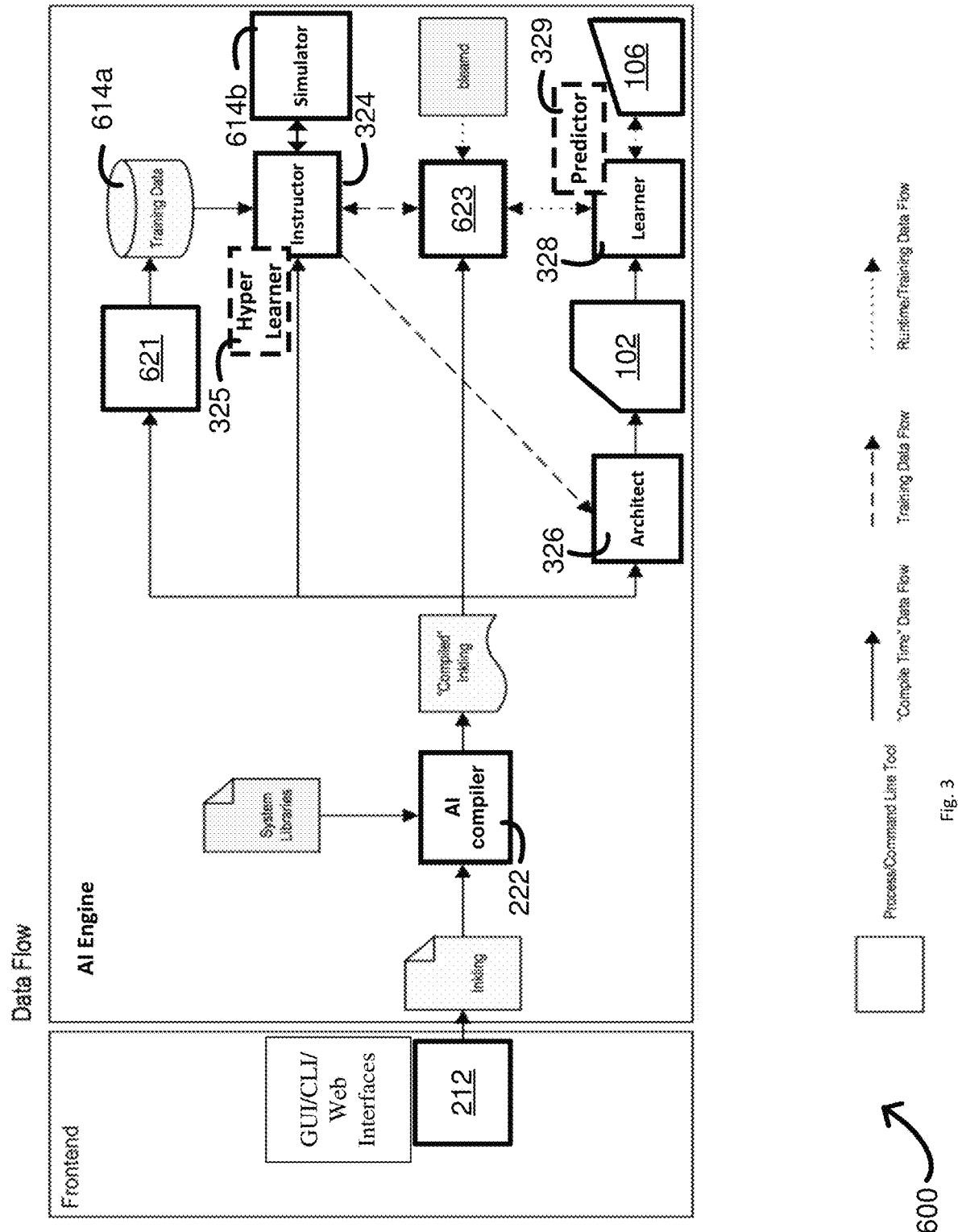

FIG. 3 provides a schematic illustrating an AI system in accordance with some embodiments.

Figure 4A:
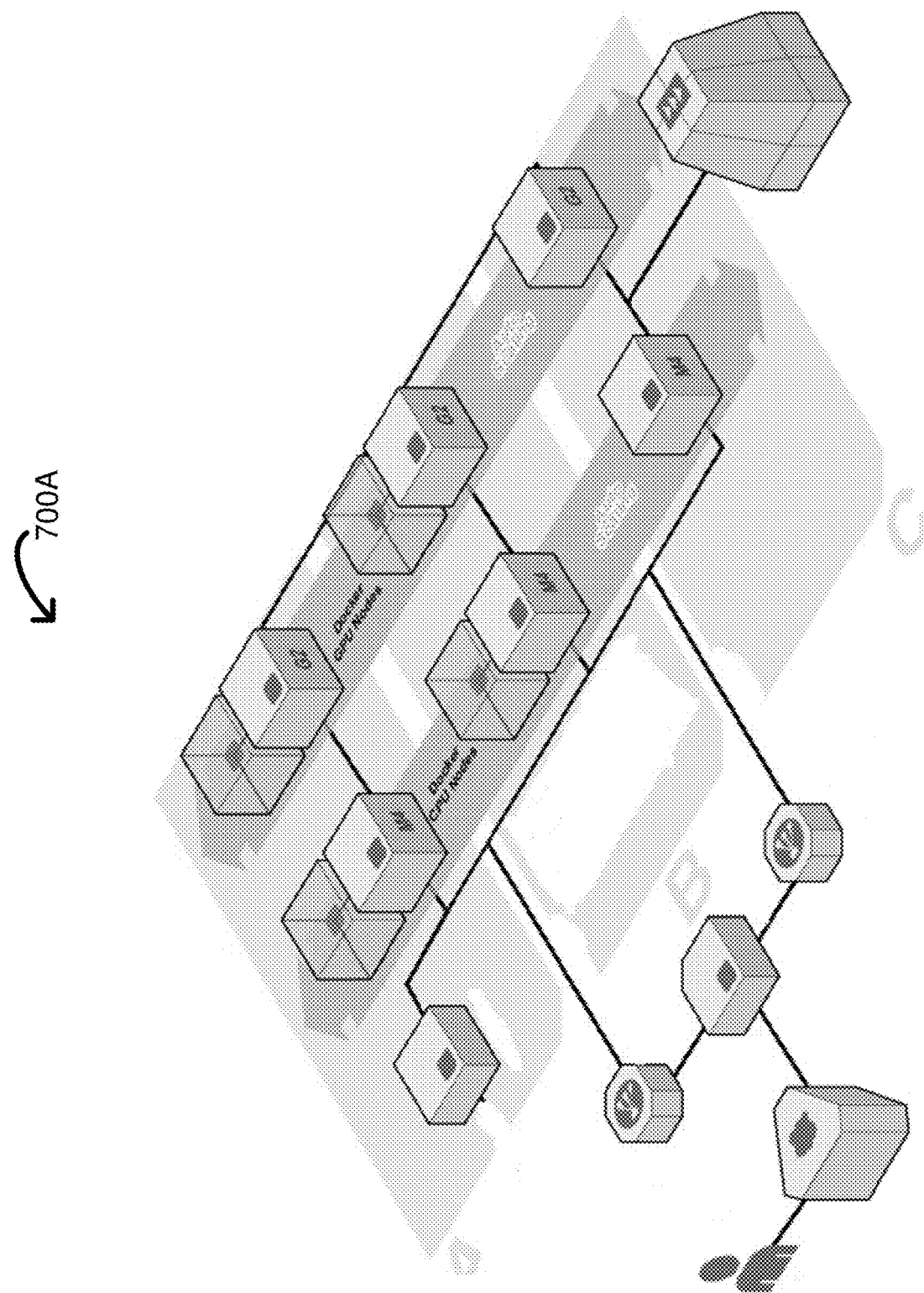

FIG. 4A provides a schematic illustrating an AI system in accordance with some embodiments.

Figure 4B:
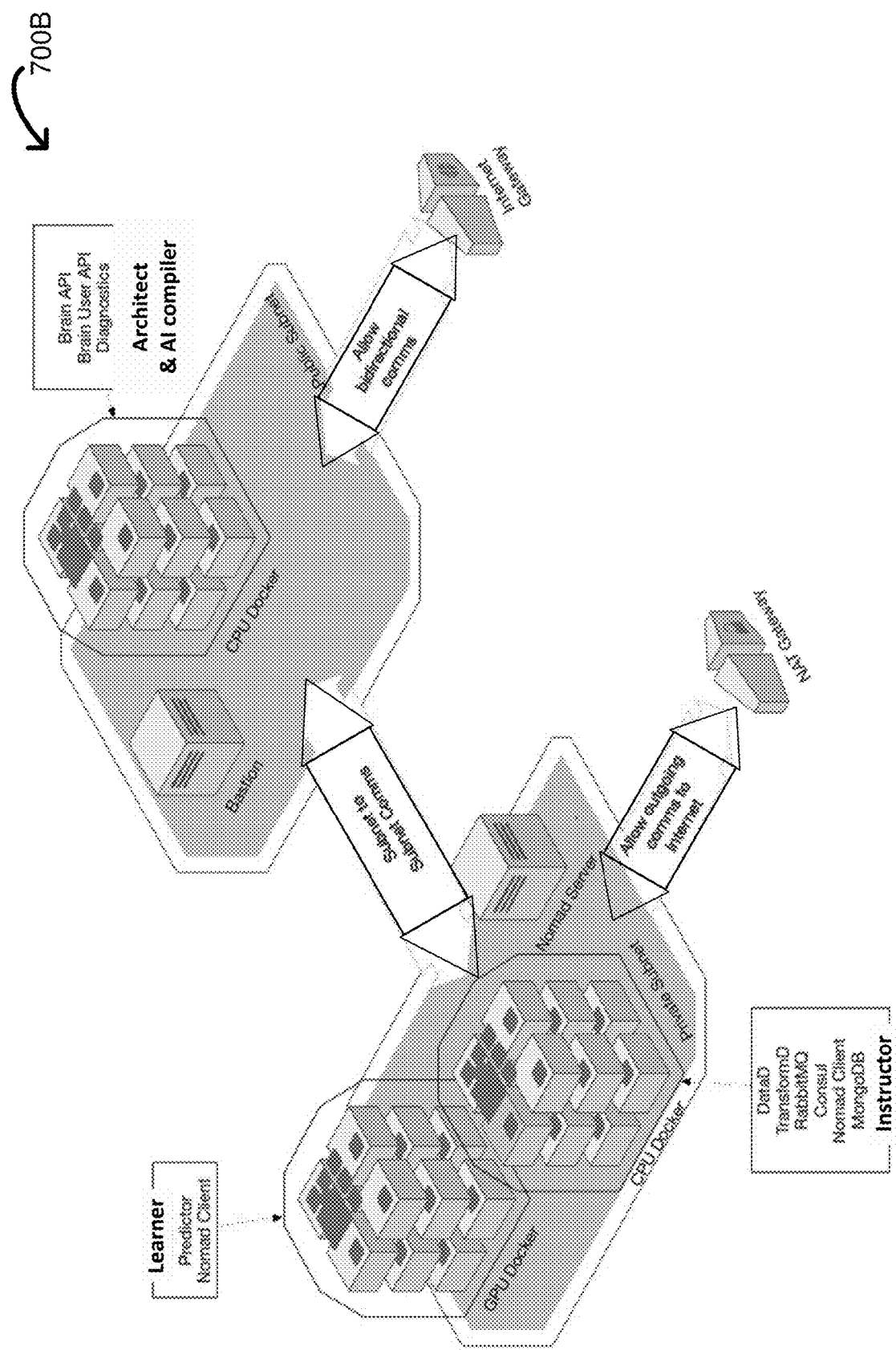

FIG. 4B provides a schematic illustrating an AI system in accordance with some embodiments.

Figure 5A:
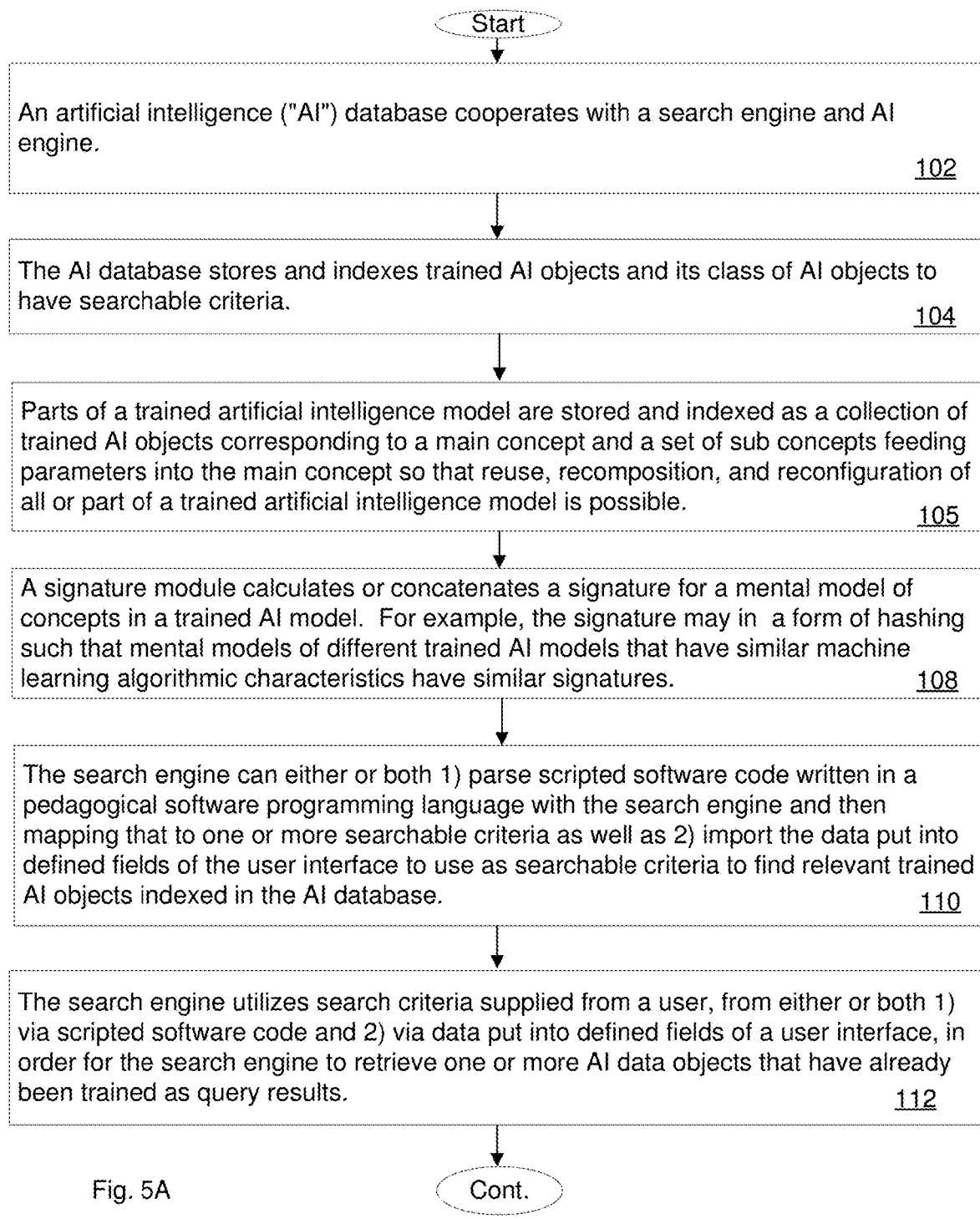

FIGS. 5A-5B illustrate a flow diagram of an embodiment of an AI database cooperating with a search engine and AI engine.

Figure 6:
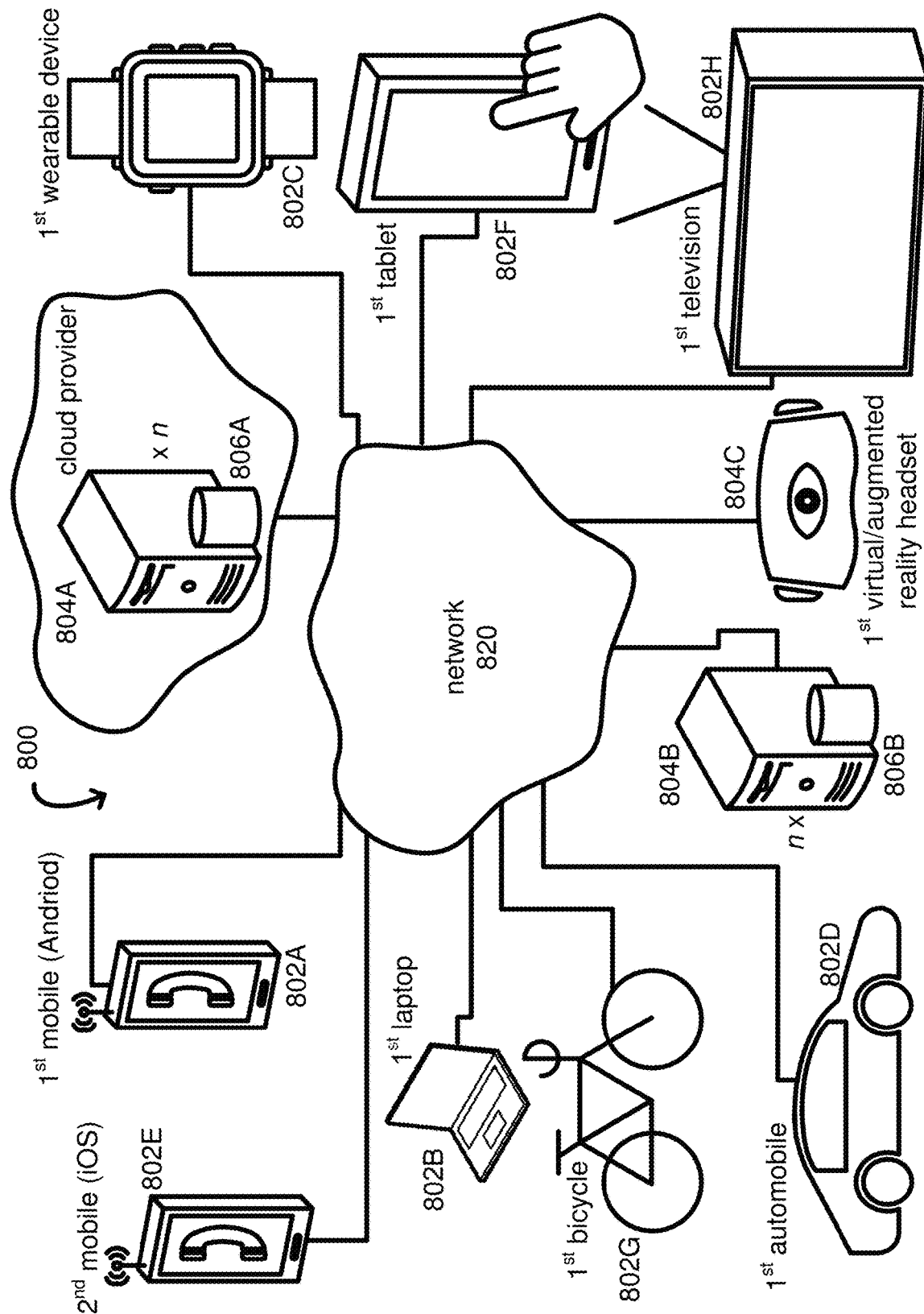

FIG. 6 provides one or more networks in accordance with some embodiments.

FIG. 7 provides one or more computing systems in accordance with some embodiments.

While the design is subject to various modifications, equivalents, and alternative forms, specific embodiments thereof have been shown by way of example in the drawings and will now be described in detail. It should be understood that the design is not limited to the particular embodiments disclosed, but—on the contrary—the intention is to cover all modifications, equivalents, and alternative forms using the specific embodiments.

DESCRIPTION

In the following description, numerous specific details are set forth, such as examples of specific data signals, named components, memory in a device, etc., in order to provide a thorough understanding of the present design. It will be apparent, however, to one of ordinary skill in the art that the present design can be practiced without these specific details. In other instances, well known components or methods have not been described in detail but rather in a block diagram in order to avoid unnecessarily obscuring the present design. Further, specific numeric references such as first database, can be made. However, the specific numeric reference should not be interpreted as a literal sequential order but rather interpreted that the first database is different than a second database. Thus, the specific details set forth are merely exemplary. The specific details can be varied from and still be contemplated to be within the spirit and scope of the present design. The term coupled is defined as meaning connected either directly to the component or indirectly to the component through another component.

In general, the AI database stores and indexes trained AI objects and its class of AI objects have searchable criteria. The AI database cooperates with the search engine to utilize search criteria supplied from a user to retrieve one or more AI data objects that have already been trained as query results. The AI database is coupled to an AI engine to allow any of reuse, reconfigure ability, and recomposition of the one or more trained AI data objects from the AI database into a new trained AI model.

FIG. 1 provides a schematic illustrating an AI system in accordance with some embodiments.

Artificial Intelligence ("AI") Database

The AI database 341 stores and indexes trained AI objects and the class of AI objects have searchable criteria. The AI database 341 of searchable AI objects indexes parameters and characteristics known about the AI objects that allows searching of user supplied criteria from either or both 1) scripted code and 2) defined fields in a user interface. The search engine 343 utilizes this search criteria supplied from the user, from either or both 1) via scripted software code and 2) via data put into defined fields of a user interface, in order for the search engine 343 to find and retrieve relevant AI data objects that have already been trained as query results. In an embodiment, the AI database also stores a specification for a model and not the fully trained AI model itself, because the untrained model has not yet been trained. The search engine's 343 use of the user supplied search criteria from the user interfaces to find relevant trained AI objects stored in the AI data will be described in more detail later.

Note, each trained AI model itself, such as a BRAIN, can be a collection of trained AI objects corresponding to a main concept and a set of sub concepts feeding parameters into the main concept. The AI database can index AI objects corresponding to the main concept and the set of sub concepts making up a given trained AI model so that reuse, recomposition, and reconfiguration of all or part of a trained AI model is possible.

The AI database 341 can be also coupled to an AI engine to allow any of reuse, reconfigure ability, and recomposition of the one or more trained AI data objects into a new trained AI model. The AI engine generates AI models, such as a first AI model 106. The AI database 341 may be part of and cooperate with various other modules of the AI engine. The AI engine has a set of user interfaces 212 to import from either or both 1) scripted software code written in a pedagogical software programming language, such as Inkling™, and/or 2) from the user interface 212 with defined fields that map user supply criteria to searchable criteria of the AI objects indexed in the AI database 341.

The AI database 341 can be part of cloud-based AI service. The AI database 341 can be hosted on cloud platform with the search engine 343 and the AI engine.

The AI database 341 cooperates with the AI engine. The AI engine may include an architect module 326, an instructor module 324, and a learner module 328. In brief, the architect module 326 creates and optimizes learning topologies of an AI object, such as the topology of a graph of processing nodes, for the AI objects. The instructor module 324 carries out a training plan codified in a pedagogical software programming language, such as Inkling™. The learner module 328 carries out an actual execution of the underlying AI learning algorithms during a training session. The architect module 326, when reconfiguring or recomposing the AI objects, composes one or more trained AI data objects into a new AI model and then the instructor module 324 and learner module 328 cooperate with one or more data sources to train the new AI model.

A user interface, to the AI database 341 and search engine 343, can be configured to present a population of known trained AI objects. The search engine 343 cooperating with the AI database 341 is configured to search the population of known trained AI objects to return a set of one or more already trained AI objects similar to a problem trying to be solved by the user supplying the search criteria.

The database management system tracking and indexing trained AI objects corresponding to concepts is configured to make it easy to search past experiments, view results, share with others, and start new variants of a new trained AI model.

The AI database 341 may be an object orientated database, a relational database, or other similar database, that stores a collection of AI objects (i.e. the trained main concept and sub concepts forming each trained AI model). The AI database 341 can be composed of a set of one or more databases in which each database has a different profile and indexing, where the set of databases are configured to operate in a parallel to then send back accurate, fast, and efficient returns of trained AI objects that satisfy the search query.

Brief Discussion of Components in the AI Engine

As discussed, the AI engine for generating the trained AI model 106 can include one or more AI-generator modules selected from at least an instructor module 324, an architect module 326, and a learner module 328 as shown. The instructor module 324 can optionally include a hyperlearner module 325, and which can be configured to select one or more hyperparameters for any one or more of a neural network configuration, a learning algorithm, a learning optimizer, and the like. The hyperlearner module 325 can optionally be contained in a different AI-generator module such as the architect module 326 or the learner module 328, or the hyperlearner module 325 can be an AI-generator module itself. The learner module 328 can optionally include a predictor module 329, which can provide one or more predictions for a trained AI model. The predictor module 329 can optionally be contained in a different AI-generator module such as the instructor module 324 or the architect module 326, or the predictor module 329 can be an AI-generator module itself. The AI engine including the foregoing one or more AI-generator modules can be configured to generate the trained AI model, such as trained AI model 106, from compiled scripted software code written in a pedagogical software programming language via one or more training cycles with the AI engine.

One or more clients 210 can make a submission to create a trained AI model. Once a Mental Model and Curricula have been coded in the pedagogical software programming language, then the code can be compiled and sent to the three main modules, the learner module 328, the instructor module 324, and the architect module 326 of the AI engine for training. One or more user interfaces 212, such a web interface, a graphical user interface, and/or command line interface, will handle assembling the scripted code written in the pedagogical software programming language, as well as other ancillary steps like registering the line segments with the AI engine, together with a single command. However, each module—the AI compiler module 222, the web enabled interface 221 to the AI engine, the learner module 328, etc.—can be used in a standalone manner, so if the author prefers to manually invoke the AI compiler module, manually perform the API call to upload the compiled pedagogical software programming language to the modules of the AI engine, etc., they have the flexibility and freedom to do so.

Thus, one or more clients 210 can send scripted code from the coder 212 or another user interface to the AI compiler 222. The AI compiler 222 compiles the scripted software code written in a pedagogical software programming language. The AI compiler 222 can send the compiled scripted code, similar to an assembly code, to the instructor module 324, which, in turn, can send the code to the architect module 326. Alternatively, the AI compiler 222 can send the compiled scripted code in parallel to all of the modules needing to perform an action on the compiled scripted code. The architect module 326 can propose a vast array of machine learning algorithms, such as various neural network layouts, as well as optimize the topology of a network of intelligent processing nodes making up an AI object. The architect module 326 can map between concepts and layers of the network of nodes and send one or more instantiated AI objects to the learner module 328. Once the architect module 326 creates the topological graph of concept nodes, hierarchy of sub concepts feeding parameters into that main concept (if a hierarchy exists in this layout), and learning algorithm for each of the main concept and sub concepts, then training by the learner module 328 and instructor module 324 may begin.

The instructor module 324 can request training data from the training data source 219. Training can be initiated with an explicit start command in the pedagogical software programming language from the user to begin training. In order for training to proceed, the user needs to have already submitted compiled pedagogical software programming language code and registered all of their external data sources such as simulators (if any are to be used) via the user interfaces with the learner and instructor modules 324, 326 of the AI engine.

The training data source 219 can send the training data to the instructor module 324 upon the request. The instructor module 324 can subsequently instruct the learner module 328 on training the AI object with pedagogical software programming language based curricula for training the concepts into the AI objects. Training an AI model can take place in one or more training cycles to yield a trained state of the AI model 106. The instructor module 324 can decide what pedagogical software programming language based concepts and streams should be actively trained in a mental model. The instructor module 324 can know what are the terminating conditions for training the concepts based on user criteria and/or known best practices. The learner module 328 or the predictor 329 can elicit a prediction from the trained AI model 106 and send the prediction to the instructor module 324. The instructor module 324, in turn, can send the prediction to the training data source 219 for updated training data based upon the prediction and, optionally, instruct the learner module 328 in additional training cycles. When the one or more training cycles are complete, the learner module 328 can save the trained state of the network of processing nodes in the trained AI model 106. (Note a more detailed discussion of different embodiments of the components making up the AI engine occurs later.)

The AI database may consists of a storage layer which is configured to know how to efficiently store database objects, in this case AI objects, an indexing mechanism to speed retrieval of the stored AI objects, a search engine to translate a query request into a retrieval strategy to retrieve AI objects that satisfy a query, and a query language which describes to the AI database what AI objects are desired to be retrieved.

Search Engine

The search engine 343 is configured to 1) parse scripted software code written in a pedagogical software programming language and then map that to one or more searchable criteria as well as 2) import the data put into defined fields of the user interface to use as searchable criteria to find relevant trained AI objects indexed in the AI database 341. In an embodiment, the search engine 343 is configured to also be able to do a natural language search of a submitted description from a user to determine what a similar trained object would be by referencing the 1) indexed criteria and/or 2) signatures and/or 3) example models in the database.

The search engine 343 uses the user supplied search criteria from the user interfaces 212 to find relevant trained AI objects stored in the AI database. The search engine 343 may look at a number of different criteria in order to find and return as search results a set of one or more similarly trained concepts. The AI database 341 has been indexed with keywords and problems solved about each stored AI object, corresponding to either a main concept or sub concept, so as to be searchable in response to query. Additional searchable criteria relative to the AI object include metadata about the specific algorithms and parameters used to train that AI object, data input type fed into the AI object, the type(s) of algorithm chosen to train the AI object, the architecture of the network of processing nodes in the AI object, the nature of the problem to be solved for each AI object, meta data metrics of how long the simulations and training took to train each main concept and sub concepts of a given trained AI model, hyperparameters, and other similar criteria discussed herein.

Note, the search engine 343 in query results will return relevant AI objects. The relevant AI objects can be evaluated and return based on a number of different weighting factors including amount of resources consumed to train that concept learned by the AI object, an estimated amount time to train the concept to achieve an accuracy threshold for the algorithm itself, data input and output types, closeness of the nature of the problem to be solved between the previous training and the user's current plans, etc.

The search engine 343 utilizes the user supplied criteria to query for relevant trained AI objects. In an embodiment, search engine 343 refers to 1) the signatures of the stored AI objects as well as 2) any indexed parameters for the AI objects indexed by the AI database 341. Thus, the search engine 343 can return similar trained objects that would have been trained to solve similar product problems by a comparison of the signatures of the AI objects as well as a check to find similar indexed parameters associated with the stored AI objects in the AI database 341. Note, the user interfaces may be configured to also allow the user refine search criteria by putting in constraints on the search in the scripted software code and/or criteria set by the user in the fields of the user interface 212.

In an embodiment, the AI database 341 and search engine 343 repetitively and recursively build an index of algorithms and parameters that have been tried in past that best satisfy some of the usual queries in order to build up something akin to human memory muscle so that not many decisions have to be made in order to quickly return relevant trained AI objects without requiring lots of calculations to determine what should be returned quickly. Later, a secondary more thorough set of trained AI objects can be returned as a second set of query results.

In an embodiment, the search engine is a standalone component in the AI system. In another embodiment, the search engine is a component within the AI database of the AI system, which has the storage (index, database) and search engine.

Concepts and Mental Models

FIGS. 2A and 2B provide schematics respectively illustrating mental models 500A and 500B in accordance with some embodiments.

A concept in a pedagogical programming language is something that an AI object can be trained on and learn. A concept can fall into one of at least two groups: fact and strategy. A fact-type concept can describe a state of one or more things such as an object, a ball, a character, an enemy, a light, a person, or the like. The state can be whether the one or more things are on or off, hot or cold, a number or a letter, or the like. The fact-type concept can also describe a location. A strategy-type concept can reflect a method or a behavior such as "avoid ghosts," "keep the paddle under the ball," "don't run into walls," "turn lights off," "get high score," or the like. Both FIGS. 4A and 4B show mental models including the strategy-type concept "get high score."

A mental model in a pedagogical programming language is also something that an AI object can be trained on and learn. A mental model can include one or more concepts structured in terms of the one or more concepts, and the mental model can further include one or more data transformation streams. As shown in FIG. 4A, a single-concept mental model can include, for example, a strategy-type concept such as "get high score." As shown in FIG. 4B, a multi-concept mental model can include a hierarchical structure including, for example, strategy-type concepts such as "keep paddle under ball" and "get high score" and state-type concepts such as "ball location." The sub concepts of "keep paddle under ball" and "ball location" feed parameters directly or indirectly into the main concept of "get high score" with the ball. A concept in a multi-concept mental model can receive input from other concepts in the mental model, send output to other concepts in the mental model, provide a final output or result output, or a combination thereof. Addition of more concepts to a mental model can decrease training time for an AI object, as well as enable a trained AI object to give smarter, more accurate predictions. Each trained concept may be AI object.

Foundational Primitives

AI systems and methods provided herein enable a teaching-oriented approach by providing a set of foundational primitives that can be used to represent AI without specifying how the AI is created. These foundational primitives are 1) concepts and mental models, 2) curricula and lessons, and 3) training sources.

More on Concepts and Mental Models

Pedagogical programming one focuses on codifying two main pillars: what are the concepts associated with the problem domain (and mentally how do they relate to each other); and, how would one go about teaching those concepts?

A concept is something that can be learned. Once learned it can provide intelligent output. An AI object may learn and be trained on a particular concept. An AI object corresponding to a particular concept can receive input data from other AI objects/concepts and simulators, and send output data to other AI objects/concepts or as a AI object corresponding to a main concept produce a final result/output. A concept can be used in isolation, but it is typically more useful to construct some structured relationship of connectivity, such as a hierarchy, between the related concepts, beginning with the relatively simple concepts and then building into more complex concepts. For example, 'ball location' is a relatively simple concept; whereas, 'get high score' with the ball is a more complex concept. In another example, a complex mental model of flying a plane may have a main concept of 'flying a plane' and numerous sub concepts such as 'how to navigate and move a plane from point A to point B', 'how to avoid crashing into objects', 'how to take off into flight', 'how to land from flight', etc. Each of the sub concepts feeds one or more outputs either directly or indirectly into the main concept of 'flying a plane' when undergoing training on the main concept. The architect module 326 creates the structured relationship of connectivity between these concepts based on user supplied guidance in the pedagogical programming language code.

As discussed, the term Mental Model may describe a set of structured concepts. The collection of concepts and their interrelation models the problem domain; and, can be referred to as the mental model. Given this choice of mental model frames, one would then codify the underlying concepts and their relationships.

Curricula and Lessons. A Curriculum is used to teach a concept. To do this, the user needs to provide data to train the concept and tell the AI engine whether the system's understanding of the concept is correct or not. This is analogous to a teacher assigning readings from a book to a student and subsequently testing the student on the contents of the book. The ways in which this data is presented is broken into individual components called Lessons. In the book analogy, Lessons could be individual chapters in the book. Lessons allow the concept to learn bit-by-bit, rather than all at once.

The concept keyword declares an abstract concept that is to be learned by the system. Ultimately, this takes the form of a transformation of data, but no information need be provided about how to perform the calculation. By declaring a concept in the scripted in a pedagogical software programming language, the programmer instructs the architect module 326 of the AI engine that this is a node in the recurrent artificial intelligence network making up the AI model that must be learned. Consequently, each concept node must have corresponding curricula to teach that node of performing its output function based on its input parameters.

Because concepts are learned by each AI model, their declarations tend to be fairly simple unless one wants to explicitly tell the architect module 326 of the artificial intelligence what learning algorithms and architecture to use. A typical statement will look something like this:

concept AbstractConceptName
is classifier
follows AntecedentConcept1, AntecedentConcept2
feeds DependentConcept1

In an embodiment, the 'follows and feeds keywords' establish connectivity in the directed graph of nodes in the trained AI model in the same way that the 'from and into keywords' do in stream declarations. In addition, however, one can optionally append a plus or minus sign (+/−) to the end of the 'follows or feeds keywords' as hints to the architect module 326. The presence of the plus or minus sign indicate whether inhibition is disallowed or desired, respectively. This is useful in a recurrent context, where, for example, a concept may have many ambiguous interpretations and inhibition can aid in resolving the ambiguity.

The keyword specifies the overall class of concept that is being modeled. For example, a classifier will learn to identify a label corresponding to its input, an estimator will learn to predict a value, a predictor will learn sequences and predict subsequent items in a sequence, etcetera. This keyword specifies the entirety of the code needed. The system will, using this code, proceed to determine an appropriate learning topology that can realize the intent. In this case, the architect module 326 laid out a deep learning neural network very much like LeNet. The instructor module 324 will then proceed to execute the best available lesson in the curriculum and will stream data to it. Upon deployment, a user would be able to stream an image into the system and get predictions out. Note that at no point were any low level artificial intelligence or machine learning algorithmic details codified by a user but rather these low level details were generated by the architect module 326 by pulling the topology of a given network processing nodes and a best machine learning algorithmic from reference databases.

An example of a trained AI model may be a Basic Recurrent Artificial Intelligence Network (BRAIN). A BRAIN is an individual AI agent, and it is programmed to learn using a software language such as Inkling. Each BRAIN can reside in the AI Engine, which manages and automates much of the lower level, complexities of working with artificial intelligences. At its heart, a BRAIN can be a basic network of intelligent processing nodes that comprise a potentially recurrent network, hence the acronym "BRAIN." In an embodiment, a trained AI model, such as trained AI model 106, may be a pedagogical programmed AI model that has been trained on one or more concepts.

Signature

The database management system engine may create a signature/fingerprint for each main concept and sub concept based on the nature of the problem being solved by the AI object. In an embodiment, the signature corresponding to the nature of the problem being solved by the AI object may also include information such as data input output types constraints placed on the curriculum and lesson plan by the user, the topology of an architecture of the artificial intelligence node including the algorithm used, the topology of the directed graph of nodes, hierarchical layout in layers of sub concept feeding parameters into a main concept included in the architecture of the AI object, and other similar information.

In an embodiment, the system may calculate a signature for a mental model of concepts in trained AI model. These signatures can be a form of hashing such that mental models that have similar machine learning algorithmic characteristics have similar signatures. These signatures can then be used in conjunction with heuristics and with Meta-learning.

In an embodiment, the signature can be a unique concatenation of include hyperparameters, the problem solved by the concept, and/or the lesson plan that the concept was trained on.

In an embodiment, the signature can include each sub concept composed into the AI object and its rich data set or discrete data output fed into a main concept; the data types in and out, the topology and other details of the composed network, what algorithm was used in training the concept the lessons defining the goals of the trained concept; the primary goal for the trained concept, etc. The primary goal for the trained concept, for example, may be flying with a secondary goal/reward positive feedback if the object avoids hitting and colliding with the ground during the flight training.

All of these are searchable criteria for the search engine 343 configured to use a signature to retrieve relevant AI objects.

More on the AI Engine

The AI system enables developers to more efficiently build, teach, and use intelligence models.

The AI engine takes in a description of a problem and how one would go about teaching concepts covering aspects of the problem to be solved, and the AI engine compiles the coded description into lower-level structured data objects that a machine can more readily understand, builds a network topology of the main problem concept and sub-concepts covering aspects of the problem to be solved, trains codified instantiations of the sub-concepts and main concept, and executes a trained AI model containing one, two, or more neural networks.

The AI engine can abstract away and automate the low-level mechanics of AI. The AI engine can manage and automate much of the lower level complexities of working with AI. Each program developed in the pedagogical programming language can be fed into the AI engine in order to generate and train appropriate intelligence models.

The AI engine can abstract generation of a neural network topology for an optimal solution and faster training time with a curriculum and lessons to teach the neural network via recursive simulations and training sessions on each node making up the neural network.

The AI engine can contain a vast array of machine learning algorithms, has logic for picking learning algorithms and guiding training, manages data streaming and data storage, and provides the efficient allocation of hardware resources. The AI engine can be built with an infrastructure that supports streaming data efficiently through the system. The AI engine can use a set of heuristics to make choices about which learning algorithms to use to train each BRAIN. The set of heuristics also make it possible for the AI engine to choose from any number of possible algorithms, topologies, etc., be able to train a number of BRAINs in parallel, and then pick the best result from all of the train BRAINs as the best trained AI model for that task.

Major Components of the AI Engine

FIG. 3 provides a schematic illustrating an AI system including an AI engine in accordance with some embodiments.

The details for any given implementation of a AI engine may vary substantially, but many have common architectural components such as the following six components: 1) an architect module 326, 2) an instructor module 324, 3) a learner module 328, 4) a compiler module 222, 5) a hyper-learner module 325, and 6) one or more interfaces 212 exchanging communications into and out of the AI engine. The AI database 341 and search engine 343 may cooperate with the modules of the AI engine as discussed above.

The AI engine can be a cloud-hosted platform-as-a-service configured to manage complexities inherent to training AI networks. Thus, the AI engine can be accessible with one or more client-side interfaces 212, GUI, CLI, and Web interfaces, to allow third parties to submit a description of a problem in a pedagogical programming language with possible sub concepts that factor in that problem and let the online AI engine build and generate a trained intelligence model for one or more of the third parties.

The AI system includes the coder 212 on the one or more client systems and the following on the one or more server systems: the AI compiler module 222; the AI-generator modules including the instructor module 324, the architect module 326, and the learner module 328, the hyperlearner 325, and the predictor 329 module 329. In addition to the foregoing, the AI system can include a training data loader 621 configured to load training data from a training data database 614*a*, a simulator 614*b*, and a streaming data server. The training data can be batched training data, streamed training data, or a combination thereof, and the AI engine can be configured to push or pull the training data from one or more training data sources selected from the simulator 614*b*, a training data generator, the training data database 614*a*, or a combination thereof. In some embodiments, a data stream manager can be configured to manage streaming of the streamed training data. Further in addition to the foregoing, FIG. 3 shows the architect module 326 configured to propose a neural network layout and the learner module 328 configured to save a trained state of a neural network such as the trained AI model 106.

The AI compiler module 222 automates conversion and compiling of the pedagogical programming language describing the problem (main concept) and sub-concepts factoring into the problem. Each statement recited in the code of the pedagogical programming language program submitted to the AI engine can be complied into a structured data object's defined fields, which can later be generated and instantiated into its own sub-concept node by the architect module 326. Each node can have one or more inputs one or more neural networks to process the input data and a resulting output decision/action. The compiled statements, commands, and other codifications fed into the AI compiler can be transformed into a lower level AI specification.

The Architect Module

The architect module 326 is the component of the system responsible for proposing and optimizing learning topologies (e.g., neural networks) based on mental models.

Neural networks can be based on a large collection of neural units loosely modeling the way a biological brain solves problems with large clusters of biological neurons connected by axons. Each neural unit is connected with many others, and links can be enforcing or inhibitory in their effect on the activation state of connected neural units. Each individual neural unit can have, for example, a summation function, which combines the values of all its inputs together. There may be a threshold function or limiting function on each connection and on the unit itself such that it must surpass it before it can propagate to other neurons. These systems are self-learning and trained rather than explicitly programmed and excel in areas where the solution or feature detection is difficult to express in a traditional computer program.

Neural networks can consist of multiple layers or a cube design, and the signal path can traverse from front to back. The goal of the neural network is to solve problems in the same way that the human brain would, although several neural networks are much more abstract. Modern neural network projects typically work with a few thousand and up to a few million neural units and millions of connections.

The architect module 326 can take the codified mental model and pedagogy and then propose a set of candidate low-level learning algorithms, topologies of a main concepts and sub-concepts, and configurations thereof the architect module 326 believes will best be able to learn the concepts in the model. This is akin to the work that a data scientist does in the toolkit approach, or that the search system automates in the approach with statistical data analysis tools. Here, it is guided by the pedagogical program instead of being a broad search. The architect module 326 can employ a variety of techniques to identify such models. The architect module 326 can generate a directed graph of nodes. The architect module 326 can break down the problem to be solved into smaller tasks/concepts all factoring into the more complex main problem trying to be solved based on the software code and/or data in the defined fields of the user interface supplied from the user/client device. The architect module 326 can instantiate a main concept and layers of sub-concepts feeding into the main concept. The architect module 326 can generate each concept including the sub-concepts with a tap that stores the output action/decision and the reason why that node reached that resultant output (e.g., what parameters dominated the decision and/or other factors that caused the node to reach that resultant output). This stored output of resultant output and the reasons why the node reached that resultant output can be stored in the trained intelligence model. The tap created in each instantiated node allows explainability for each step on how a trained intelligence model produces its resultant output for a set of data input. The architect module 326 can reference a database of algorithms to use as well as a database of network topologies to utilize. The architect module 326 can reference a table or database of best suggested topology arrangements including how many layers of levels in a topology graph for a given problem, if available. The architect module 326 also has logic to reference similar problems solved by comparing signatures. If the signatures are close enough, the architect module 326 can try the topology used to optimally solve a problem stored in an archive database with a similar signature. The architect module 326 can also instantiate multiple topology arrangements all to be tested and simulated in parallel to see which topology comes away with optimal results. The optimal results can be based on factors such as performance time, accuracy, computing resources needed to complete the training simulations, etc.

In some embodiments, for example, the architect module 326 can be configured to propose a number of neural networks and heuristically pick an appropriate learning algorithm from a number of machine learning algorithms in one or more databases for each of the number of neural networks. Instances of the learner module 328 and the instructor module 324 can be configured to train the number of neural networks in parallel. The number of neural networks can be trained in one or more training cycles with the training data from one or more training data sources. The AI engine can subsequently instantiate a number of trained AI models based on the concepts learned by the number of neural networks in the one or more training cycles, and then identify a best trained AI model (e.g., by means of optimal results based on factors such as performance time, accuracy, etc.) among the number of trained AI models.

The user can assist in building the topology of the nodes by setting dependencies for particular nodes. The architect module 326 can generate and instantiate neural network topologies for all of the concepts needed to solve the problem in a distinct two-step process. The architect module 326 can generate a description of the network concepts. The architect module 326 can also take the description and instantiate one or more topological shapes, layers, or other graphical arrangements to solve the problem description. The architect module 326 can select topology algorithms to use based on factors such as whether the type of output the current problem has either 1) an estimation output or 2) a discrete output and then factors in other parameters such as performance time to complete the algorithm, accuracy, computing resources needed to complete the training simulations, originality, amount of attributes, etc.

The Instructor Module

The instructor module 324 is a component of the system responsible for carrying out a training plan codified in the pedagogical programming language. Training can include teaching a network of intelligent processing nodes to get one or more outcomes, for example, on a simulator. To do so, the instructor module 324 can form internal representations about the system's mastery level of each concept, and adapt the execution plan based on actual performance during training. The directed graph of lessons can be utilized by the instructor module 324 to determine an execution plan for training (e.g., which lessons should be taught in which order). The training can involve using a specific set of concepts, a curriculum, and lessons, which can be described in the pedagogical programming language file.

The instructor module 324 can train easier-to-understand tasks earlier than more complex tasks. Thus, the instructor module 324 can train sub-concept AI objects and then higher-level AI objects. The instructor module 324 can train sub-concept AI objects that are dependent on other nodes after those other AI objects are trained. However, multiple nodes in a graph may be trained in parallel. The instructor module 324 can run simulations on the AI objects with input data including statistics and feedback on results from the AI object being trained from the learner module 328. The learner module 328 and instructor module 324 can work with a simulator or other data source to iteratively train an AI object with different data inputs. The instructor module 324 can reference a knowledge base of how to train an AI object efficiently by different ways of flowing data to one or more AI objects in the topology graph in parallel, or, if dependencies exist, the instructor module 324 can train serially with some portions of lessons taking place only after earlier dependencies have been satisfied. The instructor module 324 can reference the dependencies in the topology graph, which the dependencies can come from a user specifying the dependencies and/or how the arrangement of AI objects in the topology was instantiated. The instructor module 324 can supply data flows from the data source such as a simulator in parallel to multiple AI objects at the same time where computing resources and a dependency check allows the parallel training.

The instructor module 324 may flow data to train AI objects from many data sources including, but not limited to a simulator, a batch data source, a random-data generator, and historical/guided performance form from past performance. A simulator can give data and get feedback from the instructor module 324 during the simulation that can create an iterative reactive loop from data inputs and data outputs from the AI objects. A batch data source can supply batched data from a database in at least one example. A random-data generator can generate random data based on user-input parameters.

When starting a training operation, the instructor module 324 first generates an execution plan. This is the ordering it intends to use when teaching the concepts, and for each concept which lessons it intends to teach in what order. While the execution plan is executing, the instructor module 324 may jump back and forth between concepts and lessons to optimize the learning rate. By not training each concept fully before starting to train dependent concepts, the system naturally avoids certain systemic machine learning problems such as overfitting. The major techniques used to determine when to switch between lessons and concepts for training are reinforcement learning and adaptive learning. For example, for a first main problem of determining an amount of bankruptcy's in the united states, a first AI object corresponding to a sub concept may be trained in a first lesson on how to determine bankruptcy filings in California. A second lesson may train the first AI object next on how to determine bankruptcy filings in California and York. Successive lessons on an AI object can build upon and augment earlier lessons that the AI object was trained on.

The instructor module 324 looks to reuse similar training flows that have solved similar problems with similar signatures in the past.

Learner Module

The learner module 328 is a component of the system configured to carry out the actual execution of the low-level, underlying AI algorithms. In training mode, the learner module 328 can instantiate a system conforming to what was proposed by the architect module 326, interface with the instructor module 324 to carry out the computation and assess performance, and then execute the learning algorithm itself. The learner module 328 can instantiate and execute an instance of the already trained system. Eventually, the learner module 328 writes out network states for each trained sub-AI object and then a combination of the topological graph of the main node with all of the sub-nodes into a trained AI model. The learner module 328 can also write the stored output of each node and why that node arrived at that output into the trained AI model, which gives explainability as to how and why the AI proposes a solution or arrives at an outcome.

Hyperlearner Module

The hyperlearner module 325 can perform a comparison of a current problem to a previous problem in one or more databases. The hyperlearner module 325 can reference archived, previously built and trained intelligence models to help guide the instructor module 324 to train the current model of nodes. The hyperlearner module 325 can parse an archive database of trained intelligence models, known past similar problems and proposed solutions, and other sources. The hyperlearner module 325 can compare previous solutions similar to the solutions needed in a current problem as well as compare previous problems similar to the current problem to suggest potential optimal neural network topologies and training lessons and training methodologies.

Simulator

When, the curriculum trains using a simulation or procedural generation, then the data for a lesson is not data to be passed to the learning system, but the data is to be passed to the simulator. The simulator can use this data to configure itself, and the simulator can subsequently produce a piece of data for the learning system to use for training. This separation permits a proper separation of concerns. The simulator is the method of instruction, and the lesson provides a way to tune that method of instruction, which makes it more or less difficult depending on the current level of mastery exhibited by the learning system. A simulation can run on a client machine and stream data to the AI engine for training. In such an embodiment, the client machine needs to remain connected to the AI engine while the BRAIN is training. However, if the client machine is disconnected from the server of the AI engine, it can automatically pick up where it left off when it is reconnected. Note, if the system trains using data, then the data is optionally filtered/augmented in the lessons before being passed to the learning system.

Note, 1) simulations and procedural generation are a good choice versus data in a variety of circumstances; and 2) concepts are a good choice versus streams when you can more easily teach versus calculate.

Training Mode

A machine learning algorithm may have of a target/outcome variable (or dependent variable) which is to be predicted from a given set of predictors (independent variables). Using this set of variables, the AI engine generates a function that map inputs to desired outputs. The coefficients and weights plugged into the equations in the various learning algorithms are then updated after each epoch/pass of training session until a best set of coefficients and weights are determined for this particular concept. The training process continues until the model achieves a desired level of accuracy on the training data.

When in training mode the architect module 326 of the AI engine is configured to i) instantiate the network of processing nodes in any layers of hierarchy conforming to concepts of the problem being solved proposed by the user and ii) then the learner module 328 and instructor module 324 train the network of processing nodes in that AI model. To effect the foregoing, the AI engine can take compiled pedagogical programming language code and generate a BRAIN learning topology, and proceed to follow the curricula to teach the concepts as specified. Depending on the model, training can potentially take substantial amounts of time. Consequently, the AI engine can provide interactive context on the status of training including, for example, showing which nodes are actively being trained, the current belief about each node's mastery of its associated concept, overall and fine-grained accuracy and performance, the current training execution plan, and/or an estimate of completion time. As such, in some embodiments, the AI engine can be configured to provide one or more training status updates on training a neural network selected from i) an estimation of a proportion of a training plan completed for the neural network, ii) an estimation of a completion time for completing the training plan, iii) the one or more concepts upon which the neural network is actively training, iv) mastery of the neural network on learning the one or more concepts, v) fine-grained accuracy and performance of the neural network on learning the one or more concepts, and vi) overall accuracy and performance of the neural network on learning one or more mental models.

Because the process of building pedagogical programs is iterative, the AI engine in training mode can also provide incremental training. That is to say, if the pedagogical programming language code is altered with respect to a concept that comes after other concepts that have already been trained, those antecedent concepts do not need to be retrained.

Additionally, in training mode, the user is able to specify what constitutes satisfactory training should the program itself permit indefinite training.

Algorithm Selection

A first step an AI engine can take is to pick an appropriate learning algorithm to train a mental model. This is a notable step in training AI, and it is a step those without AI expertise cannot perform without expert guidance. The AI engine can have knowledge of many of the available learning algorithms, as well as a set of heuristics for picking an appropriate algorithm including an initial configuration to train from.

The process of picking an appropriate algorithm, etc., can be performed by a BRAIN that has been trained (and will continue to be trained) by the AI engine, meaning the BRAIN will get better at building BRAINs each time a new one is built. A trained AI-engine neural network, such as a BRAIN, thereby provides enabling AI for proposing neural networks from assembly code and picking appropriate learning algorithms from a number of machine learning algorithms in one or more databases for training the neural networks. The AI engine can be configured to continuously train the trained AI-engine neural network in providing the enabling AI for proposing the neural networks and picking the appropriate learning algorithms thereby getting better at building BRAINs.

The architect module 326 can also use heuristics, mental model signatures, statistical distribution inference, and Meta-learning in topology and algorithm selection.

First, the AI engine and the architect module 326 thereof can be configured to heuristically pick an appropriate learning algorithm from a number of machine learning algorithms in one or more databases for training the neural network proposed by the architect module 326. Many heuristics regarding the mental model can be used to inform what types of AI and machine learning algorithms can be used. For example, the data types used have a large influence. For this reason, the pedagogical programming language contains rich native data types in addition to the basic data types. If the architect module 326 sees, for example, that an image is being used, a convolutional deep learning neural network architecture might be appropriate. If the architect module 326 sees data that is temporal in nature (e.g., audio data, sequence data, etc.), then a recursive deep-learning neural network architecture like a long short-term memory ("LSTM") network might be more appropriate. The collection of heuristics can be generated by data science and machine learning/AI experts who work on the architect module 326 codebase, and who attempt to capture the heuristics that they themselves use in practice.

In addition to looking at the mental model, the architect module 326 can also consider the pedagogy provided in the pedagogical programming language code. It can, for example, look at the statistical distribution of any data sets being used; and, in the case of simulators, it can ask the simulator to generate substantial amounts of data so as to determine the statistics of data that will be used during training. These distribution properties can further inform the heuristics used.

Meta-Learning

Meta-learning is an advanced technique used by the architect module 326. It is, as the name implies, learning about learning. What this means is that as the architect module 326 can generate candidate algorithm choices and topologies for training, it can record this data along with the signature for the model and the resultant system performance. This data set can then be used in its own learning system. Thus, the architect module 326, by virtue of proposing, exploring, and optimizing learning models, can observe what works and what doesn't, and use that to learn what models it should try in the future when it sees similar signatures.

To effect meta-learning, the AI engine can include a meta-learning module configured to keep a record such as a meta-learning record in one or more databases. The record can include i) the source code processed by the AI engine, ii) mental models of the source code and/or signatures thereof, iii) the training data used for training the neural networks, iv) the trained AI models, v) how quickly the trained AI models were trained to a sufficient level of accuracy, and vi) how accurate the trained AI models became in making predictions on the training data.

For advanced users, low-level details of a learning topology can be explicitly specified completely or in part. The architect module 326 can treat any such pinning of parameters as an override on its default behavior. In this way, specific algorithms can be provided, or a generated model can be pinned for manual refinement.

Guiding Training

The first step the AI engine will take is to pick an appropriate learning algorithm to train the Mental Model. This is a critical step in training AI. The AI engine has knowledge of many of the available learning algorithms and has a set of heuristics for picking an appropriate algorithm as well as an initial configuration to train from.

Once an algorithm is chosen, the AI engine will proceed with training the BRAIN's Mental Model via the Curricula. The AI engine manages all of the data streaming, data storage, efficient allocation of hardware resources, choosing when to train each concept, how much (or little) to train a concept given its relevance within the Mental Model (i.e. dealing with the common problems of overfitting and underfitting), and generally is responsible for producing a trained AI model based on the given Mental Model and Curricula. As is the case with picking an appropriate learning algorithm, guiding training—notably avoiding overfitting and underfitting—to produce an accurate AI solution is a task that requires knowledge and experience in training AIs. The AI engine has an encoded set of heuristics manage this without user involvement. Similarly, the process of guiding training is also a trained AI model that will only get smarter with each trained AI model it trains. The AI engine is thus configured to make determinations regarding i) when to train the AI model on each of the one or more concepts and ii) how extensively to train the AI model on each of the one or more concepts. Such determinations can be based on the relevance of each of one or more concepts in one or more predictions of a trained AI model based upon training data.

The AI engine can also determine when to train each concept, how much (or little) to train each concept based on its relevance, and, ultimately, produce a trained BRAIN. Furthermore, the AI engine can utilize meta-learning. In meta-learning, the AI engine keeps a record of each program it's seen, the data it used for training, and the generated AIs that it made. It also records how fast those AIs trained and how accurate they became. The AI engine learns over that dataset.

Note, when training of an AI object occurs, the hyper learner module 328 can be configured to save into the AI database 341 two versions of an AI object. A first version of an AI object is a collapsed tensile flow representation of the AI object. A second version of an AI object is the representation left in its nominal non-collapsed state. When the search engine 343 retrieves the AI object in its nominal non-collapsed state, then another programmer desiring to reuse the AI object will be able to obtain outputs from the non-collapsed graph of nodes with all of its rich meta-data rather and then a collapsed concept with a single discrete output. The state of the AI data objects can be in a non-collapsed state so the trained AI object has its full rich data set, which then may be used by the user for reuse, reconfigured, or recomposed into a subsequent trained AI model.

The database management system also indexes and tracks different AI objects with an indication of what version is this AI object. Later versions of an AI object may be better trained for particular task but earlier versions of the AI object maybe more generally trained; and thus, reusable for wider range of related tasks, to then be further trained for that specific task.

The AI database 341 and other components in the AI engine cooperate to allow migrations of learned state to reconfigure a trained AI object. When a system has undergone substantial training achieving a learned state, and a subsequent change to the underlying mental models might necessitate retraining, it could be desirable to migrate the learned state rather than starting training from scratch. The AI engine can be configured to afford transitioning capabilities such that previously learned high dimensional representations can be migrated to appropriate, new, high dimensional representations. This can be achieved in a neural network by, for example, expanding the width of an input layer to account for alterations with zero-weight connections to downstream layers. The system can then artificially diminish the weights on connections from the input that are to be pruned until they hit zero and can then be fully pruned.

Deploy and Use

Once a trained AI model has been sufficiently trained, it can be deployed such that it can be used in a production application. The interface for using a deployed trained AI model is simple: the user submits data (of the same type as the trained AI model was trained with) to a trained AI model-server API and receives the trained AI model's evaluation of that data.

As a practical example of how to use a deployed trained AI model, a trained AI model can first be trained to recognize hand-written digits from the Mixed National Institute of Standards and Technology ("MNIST") dataset. An image can be created containing a handwritten digit, perhaps directly through a touch-based interface or indirectly by scanning a piece of paper with the handwritten digit written on it. The image can then be down sampled to a resolution of 28×28 and converted to grayscale, as this is the input schema used to train the example trained AI model. When submitted to the trained AI model-server through the trained AI model server API, the trained AI model can take the image as input and output a one-dimensional array of length 10 (whereby each array item represents the probability, as judged by the trained AI model, that the image is a digit corresponding to the index). The array could be the value returned to the user from the API, which the user could use as needed.

Though a linear approach to building a trained AI model is presented in some embodiments, an author-train-deploy workflow does not have to be treated as a waterfall process. If the user decides further refinement of a trained AI model is needed, be it through additional training with existing data, additional training with new, supplemental data, or additional training with a modified version of the mental model or curricula used for training, the AI engine is configured to support versioning of BRAINs so that the user can preserve (and possibly revert to) the current state of a BRAIN while refining the trained state of the BRAIN until a new, more satisfactory state is reached.

Marketplace for Recomposition, Reconfiguration and Reuse

Because a pedagogical software programming language, such as Inkling™, has been designed to enable code reuse of both the main concept being trained as well as all of the sub concepts feeding parameters into that main concept being trained, the AI database 341 is establishing a component marketplace where users can share and purchase each other's trained concepts. This effective combines a standard language package index with an app store. By separating the concept declarations from the curricula declarations, authors can share their trained main concepts and sub concepts with the full mental models, while keeping the pedagogy for training those concepts proprietary. Since many developers may be concurrently working on a component either main concept or sub concept of a given trained AI model, the AI database 341 also handles keeping representations that are under development, in training, and deployed as separate versions of that concept.

Two or more AI objects can be merged for recomposition and into a new AI object that then in one more sessions learn to work with each other to form a new trained AI model. The simulation time to fully train each of those two or more AI objects merged for recomposition is a much shorter time than starting from scratch and having to train the two or more concepts and then having those two concepts having to figure out how to work with each other to achieve an optimal result.

The AI database 341, AI engine, and search engine 343 cooperate for storage and retrieval of a database of AI concepts, which can create a new subsequent AI trained object by essentially merging one or more stored trained AI objects with more AI objects in order to recompose to get a new trained AI model.

The AI object may be reconfigured and trained with new coefficients for the learning algorithm. Additionally, the AI object may also be reused with the same set of coefficients for its learning algorithm. Again, as an example, later different versions of an AI object may be better trained for particular task but earlier versions of the AI object maybe more generally trained; and thus, reusable for wider range of related tasks, to then be further trained for that specific task.

The AI database 341, AI engine, and search engine 343 cooperate to retrain, reuse, recompose, all or just a portion of a trained AI model.

Command Line Interface ("CLI")

The CLI is a tool configured to enables users to configure the AI engine. The CLI is especially useful for automation and connection to other tools. Some actions can only be performed using the CLI. Some actions that can be performed using the CLI include loading a pedagogical programming language file and connecting a simulator.

Web Site

The web site is configured as a browser-based tool for configuring and analyzing BRAINs stored in the AI engine. The website can be used for sharing, collaborating, and learning. Some information that can be accessed from the web site is a visualization of a BRAIN's training progress.

Backend Infrastructure

FIG. 4A provides a schematic illustrating an AI system 700A in accordance with some embodiments.

As shown, a user such as a software developer can interface with the AI system 700A through an online interface; however, the user is not limited to the online interface, and the online interface is not limited to that shown in FIG. 4A. With this in mind, the AI system 700A of FIG. 4A can enable a user to make API and web requests through a domain name system ("DNS"), which requests can be optionally filtered through a proxy to route the API requests to an API load balancer and the web requests to a web load balancer. The API load balancer can be configured to distribute the API requests among multiple BRAIN service containers running in a Docker network or containerization platform configured to wrap one or more pieces of software in a complete filesystem containing everything for execution including code, runtime, system tools, system libraries, etc. The web load balancer can be configured to distribute the web requests among multiple web service containers running in the Docker network. The Docker network or Docker BRAIN network can include central processing unit ("CPU") nodes and graphics processing unit ("GPU") nodes, the nodes of which Docker network can be auto scaled as needed. The CPU nodes can be utilized for most BRAIN-service containers running on the Docker network, and the GPU nodes can be utilized for the more computationally intensive components such as TensorFlow and the learner. As further shown in FIG. 4A, a BRAIN-service engineer can interface with the AI system 700A through virtual private cloud ("VPC") gateway and a hardened bastion host configured to secure the Docker network. An Elasticsearch-Logstash-Kibana ("ELK") stack cluster can be shared among all production clusters for dedicated monitoring and logging.

FIG. 4B provides a schematic illustrating an AI system 700B in accordance with some embodiments.

Following on the AI system 700A, the bastion host and one or more CPU nodes can be on a public subnet for bidirectional communication through an Internet gateway. One or more other CPU nodes, as well as the GPU nodes, can be on a private subnet communicatively coupled with the public subnet by means of a subnet there between. The one or more CPU nodes on the public subnet can be utilized by the compiler 222 of FIGS. 1 and 3, and the architect module 326 of FIGS. 1 and 3. The one or more other CPU nodes on the private subnet can be utilized by the instructor module 324 of FIGS. 1 and 3, and the GPU nodes can be utilized by the learner module 328 and the predictor module 329 of FIGS. 1 and 3. As further shown in FIG. 4B, the private subnet can be configured to send outgoing communications to the Internet through a network address translation ("NAT") gateway.

Overview

In view of the foregoing, one or more methods of the AI engine can include, in some embodiments, compiling an assembly code, proposing a neural network, training the neural network, and instantiating a trained AI model. The assembly code can be compiled from a source code, wherein a compiler is configured to generate the assembly code from the source code written in a pedagogical programming language. The source code can include a hierarchical mental model of one or more concepts to be learned by the neural network using training data. The source code can also include curricula of one or more lessons for training the neural network on the one or more concepts. The neural network can be proposed by one or more AI-engine modules including an architect module 326 for proposing the neural network from an assembly code. The neural network can be trained by the AI engine in one or more training cycles with training data from one or more training data sources. The trained AI model can be instantiated by the AI engine based on the one or more concepts learned by the neural network in the one or more training cycles.

In such embodiments, the AI engine can further include pushing or pulling the training data. The AI engine can be configured for pushing or pulling the training data from the one or more training sources, each of which is selected from a simulator, a training data generator, a training data database, or a combination thereof. The training data can be batched training data, streamed training data, or a combination thereof.

In such embodiments, the AI engine can further include operating the AI engine in a training mode or a predicting mode during the one or more training cycles. In the training mode, the AI engine can i) instantiate the neural network conforming to the neural network proposed by the architect and ii) train the neural network. In the predicting mode, the AI engine can instantiate and execute the trained AI model on the training data through one or more API endpoints for one or more predictions in the predicting mode.

In such embodiments, the AI engine can further include heuristically picking an appropriate learning algorithm. The AI engine can be configured for picking the appropriate learning algorithm from a number of machine learning algorithms in one or more databases for training the neural network proposed by the architect.

In such embodiments, the AI engine can further include proposing one or more additional neural networks to the foregoing, initial neural network; heuristically picking an appropriate learning algorithm for each of the one or more additional neural networks; training the neural networks in parallel; instantiating one or more additional trained AI models; and identifying a best trained AI model among the trained AI models. The architect module 326 can be configured for proposing the one or more additional neural networks. The AI engine can be configured for heuristically picking the appropriate learning algorithm from the number of machine learning algorithms in the one or more databases for each of the one or more additional neural networks. The AI engine can be configured for training the neural networks in parallel, wherein the one or more additional neural networks can also trained in one or more training cycles with the training data from the one or more training data sources. The AI engine can be configured to instantiate one or more additional trained AI models based on concepts learned by the one or more neural networks in the one or more training cycles, and the AI engine can be configured to identify a best trained AI model among the trained AI models.

In such embodiments, the AI engine can further include providing enabling AI for proposing the neural networks from the assembly code and picking the appropriate learning algorithms from the number of machine learning algorithms in the one or more databases for training the neural networks. The AI engine can continuously train a trained AI-engine neural network to provide the enabling AI for proposing the neural networks and picking the appropriate learning algorithms.

In such embodiments, the AI engine can further include keeping a record in the one or more databases with a meta-learning module. The record can include i) the source code processed by the AI engine, ii) mental models of the source code, iii) the training data used for training the neural networks, iv) the trained AI models, v) how quickly the trained AI models were trained to a sufficient level of accuracy, and vi) how accurate the trained AI models became in making predictions on the training data.

In such embodiments, the AI engine can further include making certain determinations. Such determinations can include when to train the neural network on each of the one or more concepts. Such determinations can alternatively or additionally include how extensively to train the neural network on each of the one or more concepts. The determinations can be based on the relevance of each of the one or more concepts in one or more predictions of the trained AI model based upon the training data.

In such embodiments, the AI engine can further include providing one or more training status updates on training the neural network. Such training updates can include i) an estimation of a proportion of a training plan completed for the neural network, ii) an estimation of a completion time for completing the training plan, iii) the one or more concepts upon which the neural network is actively training, iv) mastery of the neural network on learning the one or more concepts, v) fine-grained accuracy and performance of the neural network on learning the one or more concepts, and/or vi) overall accuracy and performance of the neural network on learning one or more mental models.

FIGS. 5A-5B illustrate a flow diagram of an embodiment of an AI database cooperating with a search engine and AI engine. The example steps below need not be performed in sequential order and some of the steps may be optional.

In step 102, an AI database cooperates with a search engine and AI engine.

In step 104, the AI database stores and indexes trained AI objects and its class of AI objects to have searchable criteria.

In step 105, parts of a trained artificial intelligence model are stored and indexed as a collection of trained AI objects corresponding to a main concept and a set of sub concepts feeding parameters into the main concept so that reuse, recomposition, and reconfiguration of all or part of a trained artificial intelligence model is possible.

In step 108, a signature module calculates or concatenates a signature for a mental model of concepts in a trained AI model. For example, the signature may in a form of hashing such that mental models of different trained AI models that have similar machine learning algorithmic characteristics have similar signatures.

In step 110, the search engine can either or both 1) parse scripted software code written in a pedagogical software programming language with the search engine and then mapping that to one or more searchable criteria as well as 2) import the data put into defined fields of the user interface to use as searchable criteria to find relevant trained AI objects indexed in the AI database.

In step 112, the search engine utilizes search criteria supplied from a user, from either or both 1) via scripted software code and 2) via data put into defined fields of a user interface, in order for the search engine to retrieve one or more AI data objects that have already been trained as query results.

In step 114, the search engine utilizes the user supplied criteria to query for relevant trained AI objects by referring to 1) the signatures of the stored AI objects as well as 2) any indexed parameters for the AI objects indexed by the AI database.

In step 116, a user interface presents a population of known trained AI objects; and searching the population of known trained AI objects to return a set of one or more already trained AI objects similar to a problem trying to be solved by the user supplying the search criteria.

In step 118, the AI database is configured to be a set of one or more databases so that each database has a different profile and indexing. The set of databases are configured to operate in a parallel to then send back accurate, fast, and efficient returns of trained AI objects that satisfy the search query.

In step 120, the AI database cooperate with the AI engine to supply one or more AI objects. The AI engine includes an architect module configured to create and optimize learning topologies of neural networks for the AI objects; an instructor module configured to carrying out a training plan codified in a pedagogical software programming language; and a learner module configured to carrying out an actual execution of underlying artificial intelligence learning algorithms during a training session, where the architect module, when reconfiguring or recomposing the AI objects, composes the one or more trained AI data objects into a new AI model and the instructor module and learner module cooperate with one or more data sources to train the new AI model.

In step 122, the AI database cooperates with an AI engine to cause any of reuse, reconfigure ability, and recomposition of the one or more trained AI data objects into a new trained AI model.

Network

FIG. 6 illustrates a number of electronic systems and devices communicating with each other in a network environment in accordance with some embodiments. The network environment 800 has a communications network 820. The network 820 can include one or more networks selected from an optical network, a cellular network, the Internet, a Local Area Network ("LAN"), a Wide Area Network ("WAN"), a satellite network, a fiber network, a cable network, and combinations thereof. In some embodiments, the communications network 820 is the Internet. As shown, there may be many server computing systems and many client computing systems connected to each other via the communications network 820. However, it should be appreciated that, for example, a single client computing system can also be connected to a single server computing system. As such, FIG. 6 illustrates any combination of server computing systems and client computing systems connected to each other via the communications network 820.

The communications network 820 can connect one or more server computing systems selected from at least a first server computing system 804A and a second server computing system 804B to each other and to at least one or more client computing systems as well. The server computing system 804A can be, for example, the one or more server systems 220 of FIGS. 1 and 3. The server computing systems 804A and 804B can respectively optionally include organized data structures such as databases 806A and 806B. Each of the one or more server computing systems can have one or more virtual server computing systems, and multiple virtual server computing systems can be implemented by design. Each of the one or more server computing systems can have one or more firewalls to protect data integrity.

The at least one or more client computing systems can be selected from a first mobile computing device 802A (e.g., smartphone with an Android-based operating system), a second mobile computing device 802E (e.g., smartphone with an iOS-based operating system), a first wearable electronic device 802C (e.g., a smartwatch), a first portable computer 802B (e.g., laptop computer), a third mobile computing device or second portable computer 802F (e.g., tablet with an Android- or iOS-based operating system), a smart device or system incorporated into a first smart automobile 802D, a smart device or system incorporated into a first smart bicycle 802G, a first smart television 802H, a first virtual reality or augmented reality headset 804C, and the like. The client computing system 802B can be, for example, one of the one or more client systems 210 of FIGS. 1 and 3, and any one or more of the other client computing systems (e.g., 802A, 802C, 802D, 802E, 802F, 802G, 802H, and/or 804C) can include, for example, the software application or the hardware-based system in which the trained AI model can be deployed. Each of the one or more client computing systems can have one or more firewalls to protect data integrity.

It should be appreciated that the use of the terms "client computing system" and "server computing system" is intended to indicate the system that generally initiates a communication and the system that generally responds to the communication. For example, a client computing system can generally initiate a communication and a server computing system generally responds to the communication. No hierarchy is implied unless explicitly stated. Both functions can be in a single communicating system or device, in which case, the client-server and server-client relationship can be viewed as peer-to-peer. Thus, if the first portable computer 802B (e.g., the client computing system) and the server computing system 804A can both initiate and respond to communications, their communications can be viewed as peer-to-peer. Additionally, the server computing systems 804A and 804B include circuitry and software enabling communication with each other across the network 820.

Any one or more of the server computing systems can be a cloud provider. A cloud provider can install and operate application software in a cloud (e.g., the network 820 such as the Internet) and cloud users can access the application software from one or more of the client computing systems. Generally, cloud users that have a cloud-based site in the cloud cannot solely manage a cloud infrastructure or platform where the application software runs. Thus, the server computing systems and organized data structures thereof can be shared resources, where each cloud user is given a certain amount of dedicated use of the shared resources. Each cloud user's cloud-based site can be given a virtual amount of dedicated space and bandwidth in the cloud. Cloud applications can be different from other applications in their scalability, which can be achieved by cloning tasks onto multiple virtual machines at run-time to meet changing work demand. Load balancers distribute the work over the set of virtual machines. This process is transparent to the cloud user, who sees only a single access point.

Cloud-based remote access can be coded to utilize a protocol, such as Hypertext Transfer Protocol ("HTTP"), to engage in a request and response cycle with an application on a client computing system such as a web-browser application resident on the client computing system. The cloud-based remote access can be accessed by a smartphone, a desktop computer, a tablet, or any other client computing systems, anytime and/or anywhere. The cloud-based remote access is coded to engage in 1) the request and response cycle from all web browser based applications, 3) the request and response cycle from a dedicated on-line server, 4) the request and response cycle directly between a native application resident on a client device and the cloud-based remote access to another client computing system, and 5) combinations of these.

In an embodiment, the server computing system 804A can include a server engine, a web page management component, a content management component, and a database management component. The server engine can perform basic processing and operating-system level tasks. The web page management component can handle creation and display or routing of web pages or screens associated with receiving and providing digital content and digital advertisements. Users (e.g., cloud users) can access one or more of the server computing systems by means of a Uniform Resource Locator ("URL") associated therewith. The content management component can handle most of the functions in the embodiments described herein. The database management component can include storage and retrieval tasks with respect to the database, queries to the database, and storage of data.

In some embodiments, a server computing system can be configured to display information in a window, a web page, or the like. An application including any program modules, applications, services, processes, and other similar software executable when executed on, for example, the server computing system 804A, can cause the server computing system 804A to display windows and user interface screens in a portion of a display screen space. With respect to a web page, for example, a user via a browser on the client computing system 802B can interact with the web page, and then supply input to the query/fields and/or service presented by the user interface screens. The web page can be served by a web server, for example, the server computing system 804A, on any Hypertext Markup Language ("HTML") or Wireless Access Protocol ("WAP") enabled client computing system (e.g., the client computing system 802B) or any equivalent thereof. The client computing system 802B can host a browser and/or a specific application to interact with the server computing system 804A. Each application has a code scripted to perform the functions that the software component is coded to carry out such as presenting fields to take details of desired information. Algorithms, routines, and engines within, for example, the server computing system 804A can take the information from the presenting fields and put that information into an appropriate storage medium such as a database (e.g., database 806A). A comparison wizard can be scripted to refer to a database and make use of such data. The applications may be hosted on, for example, the server computing system 804A and served to the specific application or browser of, for example, the client computing system 802B. The applications then serve windows or pages that allow entry of details.

Computing Systems

FIG. 7 illustrates a computing system 900 that can be, wholly or partially, part of one or more of the server or client computing devices in accordance with some embodiments. With reference to FIG. 7, components of the computing system 900 can include, but are not limited to, a processing unit 920 having one or more processing cores, a system memory 930, and a system bus 921 that couples various system components including the system memory 930 to the processing unit 920. The system bus 921 may be any of several types of bus structures selected from a memory bus or memory controller, a peripheral bus, and a local bus using any of a variety of bus architectures.

Computing system 900 typically includes a variety of computing machine-readable media. Computing machine-readable media can be any available media that can be accessed by computing system 900 and includes both volatile and nonvolatile media, and removable and non-removable media. By way of example, and not limitation, computing machine-readable media use includes storage of information, such as computer-readable instructions, data structures, other executable software or other data. Computer-storage media includes, but is not limited to, RAM, ROM, EEPROM, flash memory or other memory technology, CD-ROM, digital versatile disks (DVD) or other optical disk storage, magnetic cassettes, magnetic tape, magnetic disk storage or other magnetic storage devices, or any other tangible medium which can be used to store the desired information and which can be accessed by the computing device 900. Transitory media such as wireless channels are not included in the machine-readable media. Communication media typically embody computer readable instructions, data structures, other executable software, or other transport mechanism and includes any information delivery media. As an example, some client computing systems on the network 920 of FIG. 7 might not have optical or magnetic storage.

The system memory 930 includes computer storage media in the form of volatile and/or nonvolatile memory such as read only memory (ROM) 931 and random access memory (RAM) 932. A basic input/output system 933 (BIOS) containing the basic routines that help to transfer information between elements within the computing system 900, such as during start-up, is typically stored in ROM 931. RAM 932 typically contains data and/or software that are immediately accessible to and/or presently being operated on by the processing unit 920. By way of example, and not limitation, FIG. 7 illustrates that RAM 932 can include a portion of the operating system 934, application programs 935, other executable software 936, and program data 937.

The computing system 900 can also include other removable/non-removable volatile/nonvolatile computer storage media. By way of example only, FIG. 7 illustrates a solid-state memory 941. Other removable/non-removable, volatile/nonvolatile computer storage media that can be used in the example operating environment include, but are not limited to, USB drives and devices, flash memory cards, solid state RAM, solid state ROM, and the like. The solid-state memory 941 is typically connected to the system bus 921 through a non-removable memory interface such as interface 940, and USB drive 951 is typically connected to the system bus 921 by a removable memory interface, such as interface 950.

The drives and their associated computer storage media discussed above and illustrated in FIG. 7, provide storage of computer readable instructions, data structures, other executable software and other data for the computing system 900. In FIG. 9, for example, the solid state memory 941 is illustrated for storing operating system 944, application programs 945, other executable software 946, and program data 947. Note that these components can either be the same as or different from operating system 934, application programs 935, other executable software 936, and program data 937. Operating system 944, application programs 945, other executable software 946, and program data 947 are given different numbers here to illustrate that, at a minimum, they are different copies.

A user may enter commands and information into the computing system 900 through input devices such as a keyboard, touchscreen, or software or hardware input buttons 962, a microphone 963, a pointing device and/or scrolling input component, such as a mouse, trackball or touch pad. The microphone 963 can cooperate with speech recognition software. These and other input devices are often connected to the processing unit 920 through a user input interface 960 that is coupled to the system bus 921, but can be connected by other interface and bus structures, such as a parallel port, game port, or a universal serial bus (USB). A display monitor 991 or other type of display screen device is also connected to the system bus 921 via an interface, such as a display interface 990. In addition to the monitor 991, computing devices may also include other peripheral output devices such as speakers 997, a vibrator 999, and other output devices, which may be connected through an output peripheral interface 995.

The computing system 900 can operate in a networked environment using logical connections to one or more remote computers/client devices, such as a remote computing system 980. The remote computing system 980 can a personal computer, a hand-held device, a server, a router, a network PC, a peer device or other common network node, and typically includes many or all of the elements described above relative to the computing system 900. The logical connections depicted in FIG. 7 can include a personal area network ("PAN") 972 (e.g., Bluetooth®), a local area network ("LAN") 971 (e.g., Wi-Fi), and a wide area network ("WAN") 973 (e.g., cellular network), but may also include other networks. Such networking environments are commonplace in offices, enterprise-wide computer networks, intranets and the Internet. A browser application may be resident on the computing device and stored in the memory.

When used in a LAN networking environment, the computing system 900 is connected to the LAN 971 through a network interface or adapter 970, which can be, for example, a Bluetooth® or Wi-Fi adapter. When used in a WAN networking environment (e.g., Internet), the computing system 900 typically includes some means for establishing communications over the WAN 973. With respect to mobile telecommunication technologies, for example, a radio interface, which can be internal or external, can be connected to the system bus 921 via the network interface 970, or other appropriate mechanism. In a networked environment, other software depicted relative to the computing system 900, or portions thereof, may be stored in the remote memory storage device. By way of example, and not limitation, FIG. 7 illustrates remote application programs 985 as residing on remote computing device 980. It will be appreciated that the network connections shown are examples and other means of establishing a communications link between the computing devices may be used.

As discussed, the computing system 900 can include a processor 920, a memory (e.g., ROM 931, RAM 932, etc.), a built in battery to power the computing device, an AC power input to charge the battery, a display screen, a built-in Wi-Fi circuitry to wirelessly communicate with a remote computing device connected to network.

It should be noted that the present design can be carried out on a computing system such as that described with respect to FIG. 7. However, the present design can be carried out on a server, a computing device devoted to message handling, or on a distributed system in which different portions of the present design are carried out on different parts of the distributed computing system.

Another device that may be coupled to bus 921 is a power supply such as a DC power supply (e.g., battery) or an AC adapter circuit. As discussed above, the DC power supply may be a battery, a fuel cell, or similar DC power source that needs to be recharged on a periodic basis. A wireless communication module can employ a Wireless Application Protocol to establish a wireless communication channel. The wireless communication module can implement a wireless networking standard.

In some embodiments, software used to facilitate algorithms discussed herein can be embodied onto a non-transitory machine-readable medium. A machine-readable medium includes any mechanism that stores information in a form readable by a machine (e.g., a computer). For example, a non-transitory machine-readable medium can include read only memory (ROM); random access memory (RAM); magnetic disk storage media; optical storage media; flash memory devices; Digital Versatile Disc (DVD's), EPROMs, EEPROMs, FLASH memory, magnetic or optical cards, or any type of media suitable for storing electronic instructions.

Note, an application described herein includes but is not limited to software applications, mobile apps, and programs that are part of an operating system application. Some portions of this description are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like. These algorithms can be written in a number of different software programming languages such as C, C+, or other similar languages. Also, an algorithm can be implemented with lines of code in software, configured logic gates in software, or a combination of both. In an embodiment, the logic consists of electronic circuits that follow the rules of Boolean Logic, software that contain patterns of instructions, or any combination of both.

It should be borne in mind, however, that all of these and similar terms are to be associated with the appropriate physical quantities and are merely convenient labels applied to these quantities. Unless specifically stated otherwise as apparent from the above discussions, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers, or other such information storage, transmission or display devices.

Many functions performed by electronic hardware components can be duplicated by software emulation. Thus, a software program written to accomplish those same functions can emulate the functionality of the hardware components in input-output circuitry.

While the foregoing design and embodiments thereof have been provided in considerable detail, it is not the intention of the applicant(s) for the design and embodiments provided herein to be limiting. Additional adaptations and/or modifications are possible, and, in broader aspects, these adaptations and/or modifications are also encompassed. Accordingly, departures may be made from the foregoing design and embodiments without departing from the scope afforded by the following claims, which scope is only limited by the claims when appropriately construed.

What is claimed is:

1. An artificial intelligence ("AI") database hosted on cloud platform and configured to cooperate with a search engine, comprising:
    where the AI database is configured to store and index trained AI objects and its class of AI objects have searchable criteria, where the AI database is configured to cooperate with the search engine to utilize search criteria supplied from a user, from either or both 1) via scripted software code and 2) via data put into defined fields of a user interface, in order for the search engine to retrieve one or more AI data objects that have already been trained as query results, where the AI database is coupled to an AI engine to allow any of reuse, reconfigure ability, and recomposition of the one or more trained AI data objects into a new trained AI model, where reuse, reconfigure ability, and recomposition of the one or more trained AI data objects improves the functioning of the AI engine by reducing an amount of memory used and processing cycles used as compared to start training an AI model from scratch, which has not previously been through training sessions to be trained.

2. The AI database configured to cooperate with the search engine of claim 1,
    where the search engine is a component within the AI database of the AI system, where the AI database further consists of a storage layer which is configured to know how to efficiently store database objects, in this case AI objects, an indexing mechanism to speed retrieval of the stored AI objects, where the search engine is configured to translate a query request into a retrieval strategy to retrieve AI objects that satisfy a query, and a query language which describes to the AI database what AI objects are desired to be retrieved.

3. The AI database configured to cooperate with the search engine of claim 1,
    a signature module is configured to calculate a signature for a mental model of concepts in a first trained AI model, where the signature is a form of hashing such that mental models of different trained AI models that have similar machine learning algorithmic characteristics have similar signatures.

4. The AI database configured to cooperate with the search engine of claim 3,
    where the search engine utilizes the user supplied criteria to query for relevant trained AI objects by referring to 1) the signatures of the stored AI objects as well as 2) any indexed parameters for the AI objects indexed by the AI database.

5. The AI database configured to cooperate with the search engine of claim 1,
    where the AI database is composed of a set of one or more databases in which each database has a different profile and indexing, where the set of databases are configured to operate in a parallel to then send back accurate, fast, and efficient returns of trained AI objects that satisfy the search query.

6. The AI database configured to cooperate with the search engine of claim 1,
    where each trained artificial intelligence model itself is a collection of trained AI objects corresponding to a main concept and a set of sub concepts feeding parameters into the main concept, where the AI database indexes AI objects corresponding to the main concept and the set of sub concepts making up a given trained artificial intelligence model so that reuse, recomposition, and reconfiguration of all or part of a trained artificial intelligence model is possible.

7. The AI database configured to cooperate with the search engine of claim 1, further comprising:
a user interface to the AI database and search engine that is configured to present a population of known trained AI objects and the search engine cooperating with the AI database is configured to search the population of known trained AI objects to return a set of one or more already trained AI objects similar to a problem trying to be solved by the user supplying the search criteria.

8. The AI database configured to cooperate with the AI engine to supply one or more AI objects of claim 1, wherein the AI engine includes
an architect module configured to create and optimize learning topologies of neural networks for the AI objects;
an instructor module configured to carrying out a training plan codified in a pedagogical software programming language; and
a learner module configured to carrying out an actual execution of underlying AI learning algorithms during a training session, where the architect module, when reconfiguring or recomposing the AI objects, composes the one or more trained AI data objects into a new AI model and the instructor module and learner module cooperate with one or more data sources to train the new AI model.

9. The AI database configured to cooperate with the search engine of claim 1,
where the search engine is configured to import the data put into defined fields of the user interface to use as searchable criteria to find relevant trained AI objects indexed in the AI database.

10. The AI database configured to cooperate with the search engine of claim 9,
where the search engine is also configured to parse scripted software code written in a pedagogical software programming language and then map that to one or more searchable criteria.

11. A method of causing an artificial intelligence ("AI") database to cooperate with a search engine, comprising:
causing the AI database to store and index trained AI objects and its class of AI objects to have searchable criteria; and
utilizing search criteria supplied from a user, from either or both 1) via scripted software code and 2) via data put into defined fields of a user interface, in order for the search engine to retrieve one or more AI data objects that have already been trained as query results, where the AI database cooperates with an AI engine to cause any of reuse, reconfigure ability, and recomposition of the one or more trained AI data objects into a new trained AI model.

12. The method of claim 11, further comprising:
1) parsing scripted software code written in a pedagogical software programming language with the search engine and then mapping that to one or more searchable criteria as well as 2) importing the data put into defined fields of the user interface to use as searchable criteria to find relevant trained AI objects indexed in the AI database.

13. The method of claim 11, further comprising:
utilizing the user supplied criteria to query for relevant trained AI objects by referring to 1) the signatures of the stored AI objects as well as 2) any indexed parameters for the AI objects indexed by the AI database.

14. The method of claim 11, further comprising:
configuring a set of one or more databases in which each database has a different profile and indexing to be the AI database, where the set of databases are configured to operate in a parallel to then send back accurate, fast, and efficient returns of trained AI objects that satisfy the search query.

15. The method of claim 11, further comprising:
storing and indexing parts of a trained artificial intelligence model as a collection of trained AI objects corresponding to a main concept and a set of sub concepts feeding parameters into the main concept so that reuse, recomposition, and reconfiguration of all or part of a trained artificial intelligence model is possible.

16. The method of claim 11, further comprising:
configuring the AI database to cooperate with the AI engine to supply one or more AI objects, wherein the AI engine includes
an architect module configured to create and optimize learning topologies of neural networks for the AI objects;
an instructor module configured to carrying out a training plan codified in a pedagogical software programming language; and
a learner module configured to carrying out an actual execution of underlying artificial intelligence learning algorithms during a training session, where the architect module, when reconfiguring or recomposing the AI objects, composes the one or more trained AI data objects into a new AI model and the instructor module and learner module cooperate with one or more data sources to train the new AI model.

17. The method of claim 11, further comprising:
presenting a population of known trained AI objects; and
searching the population of known trained AI objects to return a set of one or more already trained AI objects similar to a problem trying to be solved by the user supplying the search criteria.

18. A non-transitory machine-readable medium configured to store data and instructions, which, when executed by one or more processors on a computing device, causes the following operations, comprising:
causing an artificial intelligence ("AI") database to cooperate with a search engine;
causing the AI database to store and index trained AI objects and its class of AI objects to have searchable criteria; and
utilizing search criteria supplied from a user, from either or both 1) via scripted software code and 2) via data put into defined fields of a user interface, in order for the search engine to retrieve one or more AI data objects that have already been trained as query results, where the AI database cooperates with an AI engine to cause any of reuse, reconfigure ability, and recomposition of the one or more trained AI data objects into a new trained AI model.

19. The non-transitory machine-readable medium of claim 18 storing instructions to cause further following operations, comprising:
either or both 1) parsing scripted software code written in a pedagogical software programming language with the search engine and then mapping that to one or more searchable criteria as well as 2) importing the data put into defined fields of the user interface to use as searchable criteria to find relevant trained AI objects indexed in the AI database.

20. The non-transitory machine-readable medium of claim 18 storing instructions to cause further following operations, comprising:
    calculating a signature for a mental model of concepts in a first trained AI model, where the signature is a form of hashing such that mental models of different trained AI models that have similar machine learning algorithmic characteristics have similar signatures.

21. The non-transitory machine-readable medium of claim 18 storing instructions to cause further following operations, comprising:
    utilizing the user supplied criteria to query for relevant trained AI objects by referring to 1) the signatures of the stored AI objects as well as 2) any indexed parameters for the AI objects indexed by the AI database.

22. The non-transitory machine-readable medium of claim 18 storing instructions to cause further following operations, comprising:
    storing and indexing parts of a trained artificial intelligence model as a collection of trained AI objects corresponding to a main concept and a set of sub concepts feeding parameters into the main concept, where the AI database indexes AI objects corresponding to the main concept and the set of sub concepts making up a given trained artificial intelligence model so that reuse, recomposition, and reconfiguration of all or part of a trained artificial intelligence model is possible.

23. The non-transitory machine-readable medium of claim 18 storing instructions to cause further following operations, comprising:
    presenting a population of known trained AI objects; and
    searching the population of known trained AI objects to return a set of one or more already trained AI objects similar to a problem trying to be solved by the user supplying the search criteria.

* * * * *